United States Patent
Lee et al.

(10) Patent No.: US 11,690,246 B2
(45) Date of Patent: Jun. 27, 2023

(54) DISPLAY PANEL AND DISPLAY APPARATUS INCLUDING COMPONENT AND TRANSMISSION AREAS

(71) Applicant: Samsung Display Co., Ltd., Yongin-si (KR)

(72) Inventors: Jihwang Lee, Yongin-si (KR); Jaehyun Kim, Yongin-si (KR); Youngseo Choi, Yongin-si (KR); Seungwoo Seo, Yongin-si (KR); Soyeon Jeong, Yongin-si (KR); Sungchul Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 17/246,396

(22) Filed: Apr. 30, 2021

(65) Prior Publication Data
US 2022/0052291 A1 Feb. 17, 2022

(30) Foreign Application Priority Data

Aug. 12, 2020 (KR) ........................ 10-2020-0101408

(51) Int. Cl.
*H01L 51/52* (2006.01)
*H01L 27/14* (2006.01)
(Continued)

(52) U.S. Cl.
CPC ......... *H10K 50/844* (2023.02); *H10K 59/122* (2023.02); *H10K 59/40* (2023.02);
(Continued)

(58) Field of Classification Search
CPC ............ H01L 51/5253; H01L 51/5256; H01L 51/5218; H01L 51/5271; H01L 2251/301;
(Continued)

(56) References Cited

U.S. PATENT DOCUMENTS 10,312,299 B2   6/2019  Jun et al.
11,069,760 B2 *  7/2021  Zhao ................... H01L 51/5237
(Continued)

FOREIGN PATENT DOCUMENTS

CN    108807487 A    11/2018
CN    109860266 A     6/2019
(Continued)

OTHER PUBLICATIONS

EPO Extended Search Report dated Feb. 3, 2022, for corresponding European Patent Application No. 21190972.6 (11 pages).

*Primary Examiner* — Ida M Soward
(74) *Attorney, Agent, or Firm* — Lewis Roca Rothgerber Christie LLP

(57) ABSTRACT

In a display panel including a main display area, a component area including a transmission area, and a peripheral area outside the main display area, the display panel includes: a substrate; an inorganic insulating layer over the substrate and including a first hole corresponding to the transmission area; a planarization layer over the inorganic insulating layer; a pixel definition layer over the planarization layer and having a thickness of 1.3 μm to 2 μm; and a thin film encapsulation layer over the pixel definition layer, wherein an angle between a side surface of the pixel definition layer and an upper surface of the planarization layer is 30 degrees to 40 degrees.

26 Claims, 14 Drawing Sheets

(51) Int. Cl.
  *H01L 27/32* (2006.01)
  *H10K 50/844* (2023.01)
  *H10K 59/40* (2023.01)
  *H10K 59/65* (2023.01)
  *H10K 59/122* (2023.01)
  *H01L 27/146* (2006.01)
  *H10K 50/818* (2023.01)
  *H10K 50/856* (2023.01)
  *H10K 59/35* (2023.01)
  *H10K 59/121* (2023.01)
  *H10K 102/00* (2023.01)

(52) U.S. Cl.
  CPC ..... *H10K 59/65* (2023.02); *G09G 2300/0408* (2013.01); *G09G 2300/0804* (2013.01); *H01L 27/14678* (2013.01); *H10K 50/818* (2023.02); *H10K 50/856* (2023.02); *H10K 59/1216* (2023.02); *H10K 59/35* (2023.02); *H10K 2102/00* (2023.02)

(58) Field of Classification Search
  CPC ............... H01L 27/323; H01L 27/3234; H01L 27/3246; H01L 27/3258; H01L 27/3211; H01L 27/14678; H01L 27/3265; G06F 3/0412; G09G 2300/0408; G09G 2300/0804
  See application file for complete search history.

(56) References Cited

U.S. PATENT DOCUMENTS

| | | | |
|---|---|---|---|
| 2015/0097173 A1 | 4/2015 | Watanabe et al. | |
| 2016/0231467 A1* | 8/2016 | Kim | G02B 3/005 |
| 2017/0287992 A1 | 10/2017 | Kwak et al. | |
| 2018/0198067 A1 | 7/2018 | Kim et al. | |
| 2020/0058728 A1 | 2/2020 | Song et al. | |
| 2020/0235187 A1 | 7/2020 | Bae et al. | |
| 2020/0258947 A1* | 8/2020 | Chung | H01L 27/3276 |
| 2020/0273927 A1* | 8/2020 | Oh | H01L 27/326 |
| 2020/0273938 A1* | 8/2020 | Yoon | H01L 51/0096 |
| 2020/0295300 A1* | 9/2020 | Chung | H01L 51/5225 |
| 2020/0312934 A1* | 10/2020 | Bae | H01L 27/3248 |
| 2020/0328377 A1* | 10/2020 | Seo | H01L 51/5253 |
| 2020/0365664 A1* | 11/2020 | Jeon | H01L 51/0027 |
| 2020/0365667 A1* | 11/2020 | Jo | H01L 51/56 |
| 2020/0365674 A1* | 11/2020 | Jeon | H01L 27/3272 |
| 2020/0373372 A1* | 11/2020 | Chung | H01L 27/3246 |
| 2020/0381502 A1* | 12/2020 | Song | H01L 27/3272 |
| 2021/0057496 A1* | 2/2021 | Bae | H01L 51/5275 |
| 2021/0066410 A1* | 3/2021 | Jo | H01L 27/3234 |
| 2021/0066648 A1 | 3/2021 | Chung et al. | |
| 2021/0068274 A1* | 3/2021 | Park | H04M 1/0268 |
| 2021/0083019 A1* | 3/2021 | Jang | H01L 27/326 |
| 2021/0091157 A1* | 3/2021 | Oh | H01L 51/0096 |
| 2021/0335930 A1 | 10/2021 | Zheng et al. | |

FOREIGN PATENT DOCUMENTS

| | | |
|---|---|---|
| KR | 10-2017-0111827 A | 10/2017 |
| KR | 10-2018-0083459 A | 7/2018 |
| KR | 10-1974377 B1 | 5/2019 |
| KR | 10-2020-0021029 A | 2/2020 |
| KR | 10-2020-0030163 A | 3/2020 |
| KR | 10-2020-0037029 A | 4/2020 |
| KR | 10-2020-0039264 A | 4/2020 |
| KR | 10-2020-0039866 A | 4/2020 |
| KR | 10-2021-0028296 A | 3/2021 |

\* cited by examiner

DISPLAY PANEL AND DISPLAY APPARATUS INCLUDING COMPONENT AND TRANSMISSION AREAS

CROSS-REFERENCE TO RELATED APPLICATION

The present application claims priority to and the benefit of Korean Patent Application No. 10-2020-0101408, filed on Aug. 12, 2020, in the Korean Intellectual Property Office, the disclosure of which is incorporated by reference herein in its entirety.

BACKGROUND

1. Field

Aspects of one or more example embodiments relate to a display panel and a display apparatus including the display panel.

2. Description of Related Art

Recently, the various uses and applications for display apparatuses has diversified. Also, display apparatuses have become thinner and lighter, and thus, the uses of display apparatuses has expanded.

As display apparatuses are used in various ways, various methods may be used to design the shapes of display apparatuses, and further, more and more functions may be combined or associated with display apparatuses.

The above information disclosed in this Background section is only for enhancement of understanding of the background and therefore the information discussed in this Background section does not necessarily constitute prior art.

SUMMARY

Aspects of one or more example embodiments relate to a display panel and a display apparatus including the display panel, and for example, to a display panel in which a display area is extended such that an image may be displayed even in an area where a component as an electronic element is arranged and a display apparatus including the display panel.

Aspects of one or more example embodiments include a display panel in which a display area is extended such that an image may be displayed even in an area where an electrical component is arranged and a display apparatus including the display panel. However, such a technical problem is an example, and embodiments according to the present disclosure are not limited thereto.

Additional aspects will be set forth in part in the description which follows and, in part, will be apparent from the description, or may be learned by practice of the presented embodiments.

According to one or more example embodiments, in a display panel including a main display area, a component area including a transmission area, and a peripheral area outside the main display area, the display panel includes: a substrate, an inorganic insulating layer arranged over the substrate and including a first hole corresponding to the transmission area, a planarization layer arranged over the inorganic insulating layer, a pixel definition layer arranged over the planarization layer and having a thickness of about 1.3 μm to about 2 μm, and a thin film encapsulation layer arranged over the pixel definition layer, wherein an angle between a side surface of the pixel definition layer and an upper surface of the planarization layer is about 30 degrees to about 40 degrees.

According to some example embodiments, the pixel definition layer may have a thickness of about 1.3 μm to about 2 μm from the upper surface of the planarization layer.

According to some example embodiments, a first inorganic encapsulation layer, an organic encapsulation layer, and a second inorganic encapsulation layer may be sequentially stacked in the thin film encapsulation layer, and the organic encapsulation layer may be arranged in the first hole.

According to some example embodiments, the planarization layer may include a second hole corresponding to the transmission area, the pixel definition layer may include a third hole corresponding to the transmission area, and the organic encapsulation layer may be arranged in the second hole and the third hole.

According to some example embodiments, the organic encapsulation layer arranged over the transmission area may have a flat upper surface.

According to some example embodiments, the organic encapsulation layer arranged over the transmission area may include a concave portion.

According to some example embodiments, a distance from a bottom surface of an upper surface of the organic encapsulation layer to a top surface of the upper surface of the organic encapsulation layer may be more than about 0 μm and less than or equal to about 2 μm.

According to some example embodiments, the organic encapsulation layer arranged over the transmission area may include a convex portion.

According to some example embodiments, a distance from a bottom surface of an upper surface of the organic encapsulation layer to a top surface of the upper surface of the organic encapsulation layer may be more than about 0 μm and less than or equal to about 2 μm.

According to some example embodiments, the display panel may further include a main display element arranged over the planarization layer corresponding to the main display area, and an auxiliary display element arranged over the planarization layer corresponding to the component area.

According to some example embodiments, the main display element may include a first pixel electrode, the auxiliary display element may include a second pixel electrode, and the pixel definition layer may expose at least a portion of the first pixel electrode and the second pixel electrode.

According to some example embodiments, the display panel may further include a touch screen layer arranged over the thin film encapsulation layer, wherein a first touch insulating layer, a second touch insulating layer, and a third touch insulating layer may be sequentially stacked in the touch screen layer, and the touch screen layer may include a first touch electrode arranged between the first touch insulating layer and the second touch insulating layer and a second touch electrode arranged between the second touch insulating layer and the third touch insulating layer.

According to some example embodiments, the first touch electrode and the second touch electrode may at least partially overlap the pixel definition layer.

According to some example embodiments, the display panel may further include a bottom metal layer arranged between the substrate and the inorganic insulating layer in the component area and including a bottom hole corresponding to the transmission area.

According to one or more example embodiments, in a display panel including a main display area, a component area including a transmission area, and a peripheral area outside the main display area, the display panel includes: a substrate, an inorganic insulating layer arranged over the substrate and including a first hole corresponding to the transmission area, a pixel definition layer arranged over the inorganic insulating layer and having a thickness of about 1.3 µm to about 2 µm, and a thin film encapsulation layer arranged over the pixel definition layer and including a first inorganic encapsulation layer, an organic encapsulation layer, and a second inorganic encapsulation layer, wherein the organic encapsulation layer includes a concave portion or a convex portion.

According to some example embodiments, a distance from a bottom surface of an upper surface of the organic encapsulation layer to a top surface of the upper surface of the organic encapsulation layer may be more than about 0 µm and less than or equal to about 2 µm.

According to some example embodiments, the display panel may further include a planarization layer arranged between the inorganic insulating layer and the pixel definition layer, wherein the pixel definition layer may have a thickness of about 1.3 µm to about 2 µm from an upper surface of the planarization layer.

According to some example embodiments, an angle between a side surface of the pixel definition layer and the upper surface of the planarization layer may be about 30 degrees to about 40 degrees.

According to some example embodiments, the organic encapsulation layer may be arranged in the first hole.

According to one or more example embodiments, a display apparatus includes a display panel including a main display area, a component area including a transmission area, and a peripheral area outside the main display area, and a component arranged under the display panel to correspond to the component area, the display panel including a substrate, an inorganic insulating layer arranged over the substrate and including a first hole corresponding to the transmission area, a planarization layer arranged over the inorganic insulating layer, a pixel definition layer arranged over the planarization layer and having a thickness of about 1.3 µm to about 2 µm, and a thin film encapsulation layer arranged over the pixel definition layer, wherein an angle between a side surface of the pixel definition layer and an upper surface of the planarization layer is about 30 degrees to about 40 degrees.

According to some example embodiments, the component may include an imaging device or a sensor.

According to some example embodiments, the pixel definition layer may have a thickness of about 1.3 µm to about 2 µm from the upper surface of the planarization layer.

According to some example embodiments, a first inorganic encapsulation layer, an organic encapsulation layer, and a second inorganic encapsulation layer may be sequentially stacked in the thin film encapsulation layer, and the organic encapsulation layer may be arranged in the first hole.

According to some example embodiments, the organic encapsulation layer arranged over the transmission area may have a flat upper surface.

According to some example embodiments, the organic encapsulation layer arranged over the transmission area may include a concave portion or a convex portion.

According to some example embodiments, a distance from a bottom surface of an upper surface of the organic encapsulation layer to a top surface of the upper surface of the organic encapsulation layer may be more than about 0 µm and less than or equal to about 2 µm.

Other aspects, features, and characteristics other than those described above will become more apparent from the following detailed description, the appended claims, and the accompanying drawings.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1:
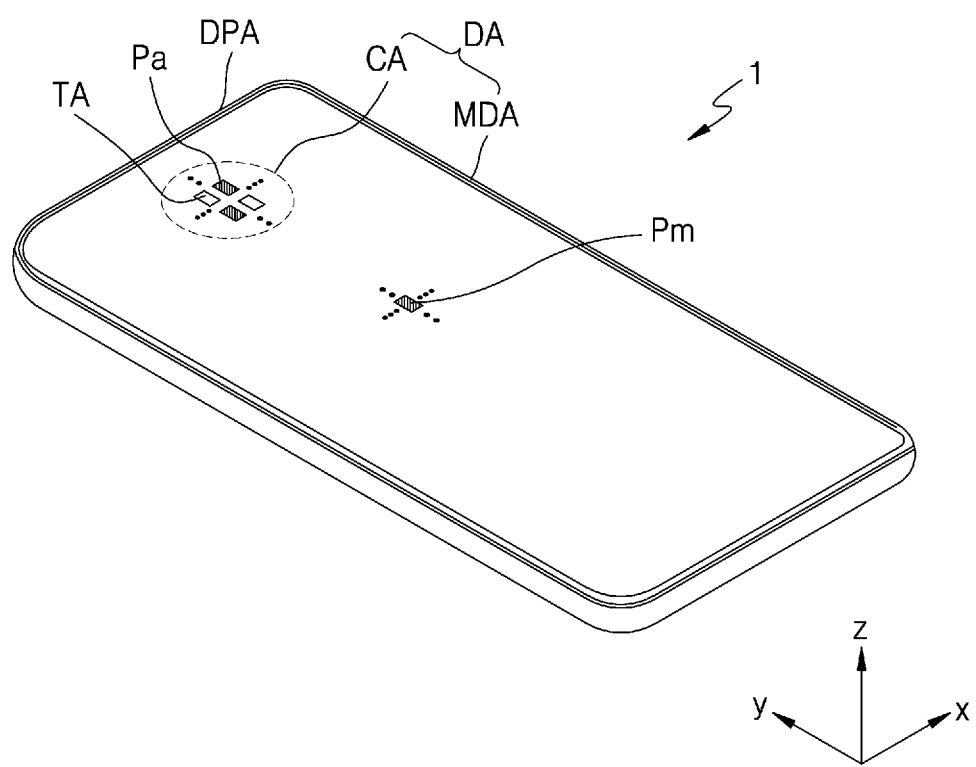
FIG. 1 is a perspective view schematically illustrating a display apparatus according to some example embodiments.

Reference will now be made in more detail to aspects of some example embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the example embodiments may have different forms and should not be construed as being limited to the descriptions set forth herein.

While such terms as "first" and "second" may be used to describe various components, such components should not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it may be directly or indirectly on the other layer, region, or component. That is, for example, intervening layers, regions, or components may be present.

Sizes of elements in the drawings may be exaggerated or reduced for convenience of description. In other words, since sizes and thicknesses of components in the drawings are arbitrarily illustrated for convenience of description, the following embodiments are not limited thereto.

In the disclosure, "A and/or B" may include "A," "B," or "A and B." In addition, in the present disclosure, "at least one of A and B" may include "A," "B," or "A and B."

In the following disclosure, it will be understood that when a line is referred to as "extending in a first direction or a second direction," it may not only extend in a linear shape, but also may extend in the first direction or the second direction in a zigzag or curved line.

In the following disclosure, a "plan view" indicates that a portion of a target object is seen from above, and a "cross-sectional view" indicates that a portion of a target object is vertically cut and the cross-section is viewed from the side. In the following disclosure, a term "overlapping" includes overlapping in a plan view and a cross-sectional view.

The disclosure will now be described more fully with reference to the accompanying drawings, in which embodiments are shown. Like reference numerals in the drawings denote like elements.

FIG. 1 is a perspective view schematically illustrating a display apparatus according to some example embodiments.

Referring to FIG. 1, a display apparatus 1 may include a display area DA and a peripheral area DPA outside the display area DA. The display area DA may include a component area CA and a main display area MDA at least partially surrounding the component area CA. Each of the component area CA and the main display area MDA may display images individually or together. The peripheral area DPA may be a type of non-display area in which display elements are not arranged. The display area DA may be entirely surrounded by the peripheral area DPA.

FIG. 1 illustrates that one component area CA is located in the main display area MDA. According to some example embodiments, the display apparatus 1 may include two or more component areas CA and the shapes and sizes of the component areas CA may be different from each other. When viewed in a direction substantially perpendicular to the top surface of the display apparatus 1 (e.g., a plan view, or a direction normal with respect to the plane of the display surface of the display area DA), the component area CA may have various shapes such as circular shapes, elliptical shapes, polygonal shapes such as tetragonal shapes, star shapes, or diamond shapes. Also, FIG. 1 illustrates that the component area CA is arranged at the upper center (in the +y direction) of the main display area MDA having a substantially rectangular shape when viewed in a direction substantially perpendicular to the top surface of the display apparatus 1; however, the component area CA may be arranged at one side of the main display area MDA having a rectangular shape, for example, at the upper right side or the upper left side thereof.

The display apparatus 1 may display images by using a plurality of main subpixels Pm arranged in the main display area MDA and a plurality of auxiliary subpixels Pa arranged in the component area CA.

As described below with reference to FIG. 2, in the component area CA, a component 40 as an electronic element may be arranged under a display panel corresponding to the component area CA. The component 40 may include an imaging device as a camera using infrared light or visible light. Alternatively, the component 40 may include a solar cell, a flash, an illuminance sensor, a proximity sensor, or an iris sensor. Alternatively, the component 40 may have a function of receiving sound. In order to minimize the limitation of the function of the component 40, the component area CA may include a transmission area TA that may transmit light and/or sound output from the component 40 to the outside or propagating toward the component 40 from the outside. In the case of a display panel and a display apparatus including the display panel according to some example embodiments, when light is transmitted through the component area CA, the light transmittance of the component area CA or the transmission area TA may be about 10% or more, for example, about 40% or more, about 25% or more, about 50% or more, about 85% or more, or about 90% or more.

A plurality of auxiliary subpixels Pa may be arranged in the component area CA. The plurality of auxiliary subpixels Pa may provide a certain image by emitting light. The image displayed in the component area CA may be an auxiliary image and may have a lower resolution than the image displayed in the main display area MDA. That is, the component area CA may include a transmission area TA through which light and sound may be transmitted, and when no subpixel is arranged on the transmission area TA, the number of auxiliary subpixels Pa that may be arranged per unit area in the component area CA may be less than the number of main subpixels Pm arranged per unit area in the main display area MDA.

Figure 2:
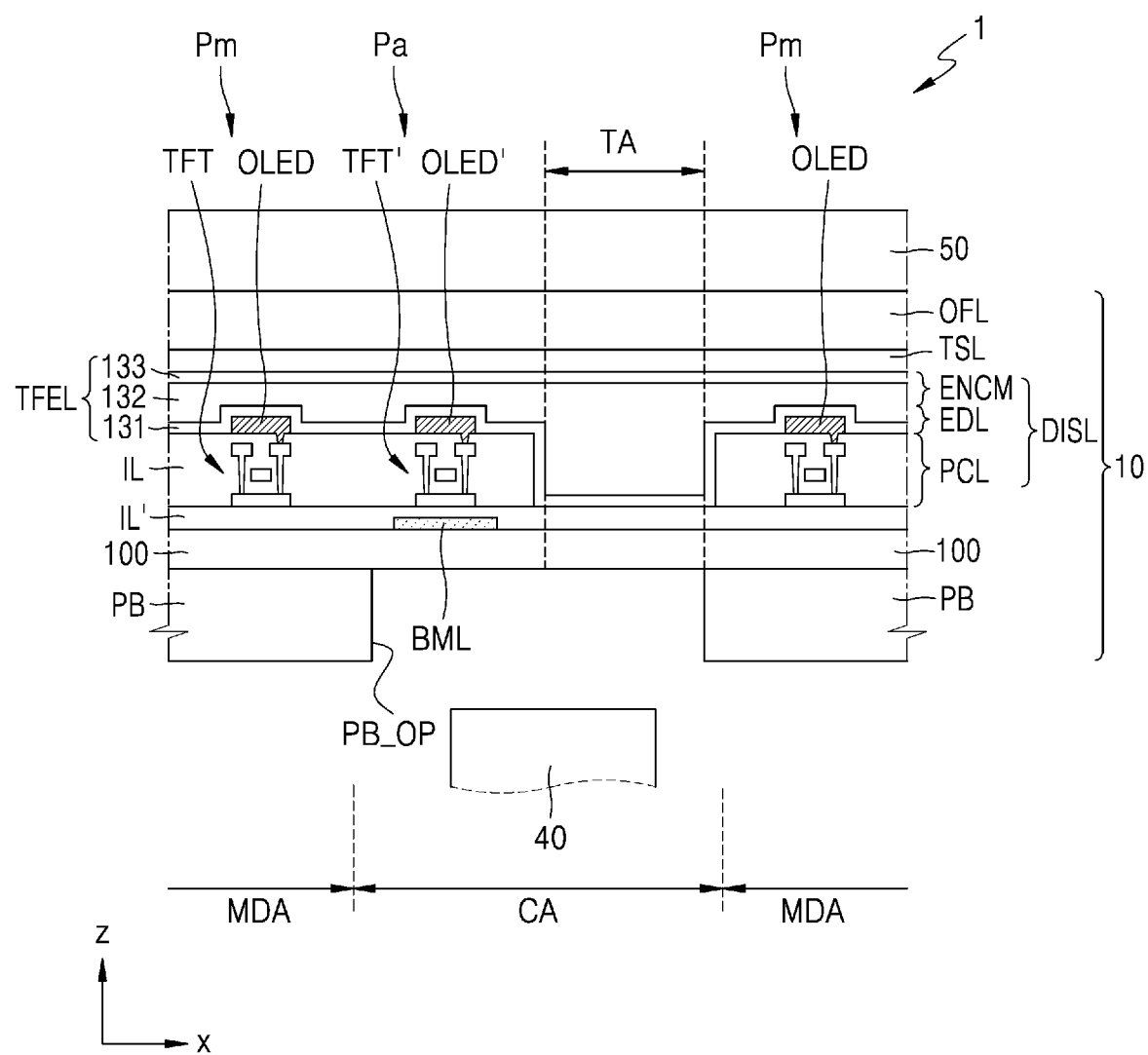
FIG. 2 is a cross-sectional view schematically illustrating a portion of a display apparatus according to some example embodiments.

FIG. 2 is a cross-sectional view schematically illustrating a portion of a display apparatus according to some example embodiments.

Referring to FIG. 2, a display apparatus 1 may include a display panel 10 and a component 40 overlapping the display panel 10. A cover window 50 for protecting the display panel 10 may be further arranged over the display panel 10.

The display panel 10 may include a component area CA overlapping the component 40 and a main display area MDA where a main image is displayed. The display panel 10 may include a substrate 100, a display layer DISL on the substrate 100, a touch screen layer TSL, an optical functional layer OFL, the cover window 50, and a panel protection member PB arranged under the substrate 100.

The display layer DISL may include a circuit layer PCL including thin film transistors TFT and TFT', a display element layer EDL including light emitting diodes OLED and OLED' as display elements, and an encapsulation member ENCM such as a thin film encapsulation layer TFEL or an encapsulation substrate. Insulating layers IL and IL' may be arranged in the display layer DISL and between the substrate 100 and the display layer DISL.

The substrate 100 may include an insulating material such as a polymer resin and may include a flexible substrate capable of bending, folding, rolling, or the like.

A main thin film transistor TFT and a main light emitting diode OLED connected thereto may be arranged in the main display area MDA of the display panel 10 to implement a main subpixel Pm, and an auxiliary thin film transistor TFT' and an auxiliary light emitting diode OLED' connected thereto may be arranged in the component area CA to implement an auxiliary subpixel Pa. An area of the component area CA in which the auxiliary subpixel Pa is arranged may be referred to as an auxiliary display area.

In the component area CA, a transmission area TA having no display elements arranged therein may be arranged. The transmission area TA may be an area through which the light/signal output from the component 40 or the light/signal input to the component 40 arranged corresponding to the component area CA is transmitted. The auxiliary display area and the transmission area TA may be alternately arranged in the component area CA.

A bottom metal layer BML may be arranged in the component area CA. The bottom metal layer BML may be arranged to correspond to the bottom of the auxiliary thin film transistor TFT'. For example, the bottom metal layer BML may be arranged between the auxiliary thin film transistor TFT' and the substrate 100. The bottom metal layer BML may prevent external light from reaching the auxiliary thin film transistor TFT'. According to some example embodiments, a constant voltage or signal may be applied to the bottom metal layer BML to prevent damage to a pixel circuit due to an electrostatic discharge.

The display element layer EDL may be covered by the thin film encapsulation layer TFEL or the encapsulation substrate. According to some example embodiments, the thin film encapsulation layer TFEL may include at least one inorganic encapsulation layer and at least one organic encapsulation layer as illustrated in FIG. 2. According to some example embodiments, the thin film encapsulation layer TFEL may include a first inorganic encapsulation layer 131 and a second inorganic encapsulation layer 133 and an organic encapsulation layer 132 therebetween.

The first inorganic encapsulation layer 131 and the second inorganic encapsulation layer 133 may include one or more inorganic insulating materials of silicon oxide, silicon nitride, and silicon oxynitride. The organic encapsulation layer 132 may include a polymer-based material. The polymer-based material may include an acrylic resin, an epoxy resin, a polyimide, and a polyethylene.

When the display element layer EDL is encapsulated by an encapsulation substrate, the encapsulation substrate may be arranged to face the substrate 100 with the display element layer EDL therebetween. A gap may be between the encapsulation substrate and the display element layer EDL. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent or reduce instances of moisture or other contaminants penetrating through the side surface thereof.

The touch screen layer TSL may be configured to obtain coordinate information according to an external input, for example, a touch event. The touch screen layer TSL may include a touch electrode and touch lines connected to the touch electrode. The touch screen layer TSL may sense an external input according to a self-capacitance method or a mutual capacitance method.

The touch screen layer TSL may be arranged on the thin film encapsulation layer TFEL. Alternatively, the touch screen layer TSL may be separately formed on a touch substrate and then coupled onto the thin film encapsulation layer TFEL through an adhesive layer such as an optical clear adhesive (OCA). According to some example embodiments, the touch screen layer TSL may be directly formed on the thin film encapsulation layer TFEL, and in this case, an adhesive layer may not be between the touch screen layer TSL and the thin film encapsulation layer TFEL.

The optical functional layer OFL may be provided to improve visibility. The optical functional layer OFL may include an anti-reflection layer. The anti-reflection layer may be configured to reduce the reflectance of light (external light) incident from the outside toward the display apparatus 1.

According to some example embodiments, the anti-reflection layer may include a polarization film. The polarization film may include a linear planarization plate and a phase delay film such as a quarter-wave ($\lambda/4$) plate. The phase delay film may be on the touch screen layer TSL, and the linear planarization plate may be on the phase delay film.

According to some example embodiments, the anti-reflection layer may include a filter layer including a black matrix and color filters. The color filters may be arranged considering the color of light emitted from each of the pixels of the display apparatus 1. For example, the filter layer may include a color filter of a red, green, or blue color.

According to some example embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and accordingly, the external light reflectance may be reduced.

The cover window 50 may be arranged over the display panel 10 to protect the display panel 10. The optical functional layer OFL may be attached to the cover window 50 with an optical clear adhesive or may be attached to the touch screen layer TSL with an optical clear adhesive.

The panel protection member PB may be attached under the substrate 100 to support and protect the substrate 100. The panel protection member PB may include an opening PB_OP corresponding to the component area CA. Because the panel protection member PB includes the opening PB_OP, the light transmittance of the component area CA may be improved. The panel protection member PB may include polyethylene terephthalate (PET) or polyimide (PI).

The component area CA may have a larger area than an area where the components 40 are arranged. Accordingly, the area of the opening PB_OP included in the panel protection member PB may not match the area of the component area CA.

Also, a plurality of components 40 may be arranged in the component area CA. The plurality of components 40 may have different functions. For example, the plurality of components 40 may include at least two of a camera (imaging device), a solar cell, a flash, a proximity sensor, an illuminance sensor, or an iris sensor.

Figure 3:
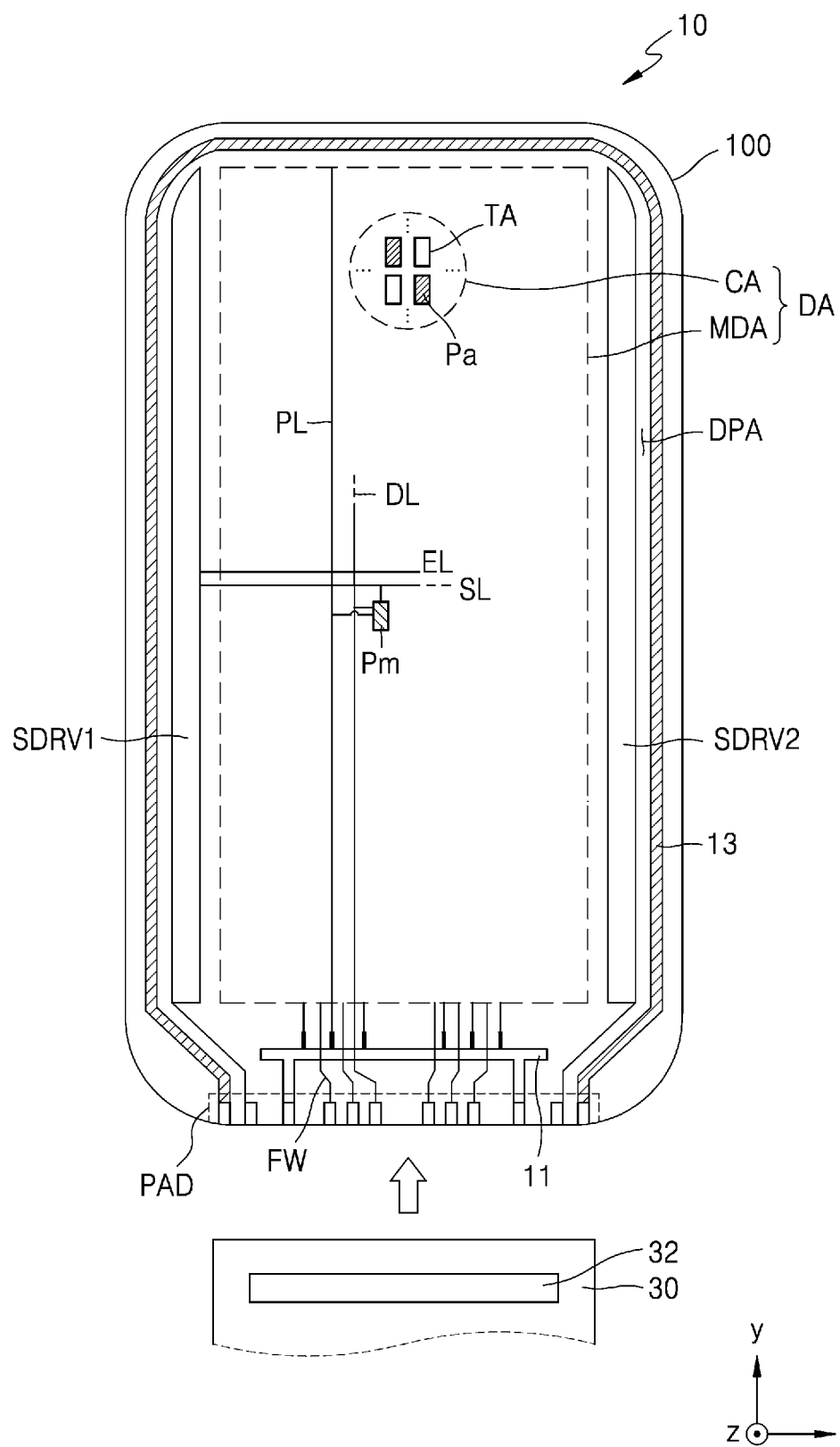
FIG. 3 is a plan view schematically illustrating a display panel that may be included in the display apparatus of FIG. 1.

FIG. 3 is a plan view schematically illustrating a display panel that may be included in the display apparatus of FIG. 1.

Referring to FIG. 3, various components constituting a display panel 10 may be arranged over a substrate 100. The substrate 100 may include a display area DA and a peripheral area DPA surrounding the display area DA. The display area DA may include a main display area MDA on which a main image is displayed, and a component area CA which includes a transmission area TA and on which an auxiliary image is displayed. The auxiliary image may form a single entire image together with the main image, or may be an image independent from the main image. That is, the auxiliary image and the main image may each form a subportion of an image such that they collectively form the entirety of the image, or the auxiliary image and the main image may separately or independently display separate images that are not part of the same image.

A plurality of main subpixels Pm may be arranged in the main display area MDA. Each of the plurality of main subpixels Pm may be implemented as a display element such as an organic light emitting diode OLED. Each of the plurality of main subpixels Pm may emit, for example, red light, green light, blue light, or white light. The main display area MDA may be covered with an encapsulation member and thus may be protected from ambient air, moisture, contaminants, or the like.

The component area CA may be located on one side of the main display area MDA as described above, or may be arranged in the display area DA and surrounded by the main display area MDA. A plurality of auxiliary subpixels Pa may be arranged in the component area CA. Each of the plurality of auxiliary subpixels Pa may be implemented by a display element such as an auxiliary organic light emitting diode OLED'. Each of the plurality of auxiliary subpixels Pa may emit, for example, red light, green light, blue light, or white light. The component area CA may be covered with an encapsulation member and thus may be protected from ambient air, moisture, or the like.

Moreover, the component area CA may include a transmission area TA. The transmission area TA may be arranged to surround a plurality of auxiliary subpixels Pa. Alternatively, the transmission area TA may be arranged in a grid form with a plurality of auxiliary subpixels Pa.

Because the component area CA has the transmission areas TA, a resolution of the component area CA may be lower than a resolution of the main display area MDA. For example, the resolution of the component area CA may be about 1/2, 3/8, 1/3, 1/4, 2/9, 1/8, 1/9, or 1/16 of the resolution of the main display area MDA. For example, the resolution of the main display area MDA may be about 400 ppi or more, and the resolution of the component area CA may be about 200 ppi or about 100 ppi.

Pixel circuits that drive the main and auxiliary subpixels Pm and Pa may be electrically connected to peripheral circuits arranged in the peripheral area DPA, respectively. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits driving the subpixels Pm and Pa, through a scan line SL. The first scan driving circuit SDRV1 may apply an emission control signal to each pixel circuit through an emission control line EL. The second scan driving circuit SDRV2 may be located on the opposite side of the first scan driving circuit SDRV1 with respect to the main display area MDA and may be substantially parallel to the first scan driving circuit SDRV1. Some of the pixel circuits of the main subpixels Pm of the main display area MDA may be electrically connected to the first scan driving circuit SDRV1, and the others may be electrically connected to the second scan driving circuit SDRV2. Some of the pixel circuits of the auxiliary subpixels Pa of the component area CA may be electrically connected to the first scan driving circuit SDRV1, and the others may be electrically connected to the second scan driving circuit SDRV2. The second scan driving circuit SDRV2 may be omitted.

The terminal portion PAD may be arranged at one side of the substrate 100. The terminal portion PAD may be exposed by not being covered by an insulating layer, to be connected to a display circuit board 30. A display driver 32 may be arranged on the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the pixel circuits of the subpixels Pm and Pa through a fan-out line FW and a data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the subpixels Pm and Pa through the driving voltage line PL connected to the driving voltage supply line 11, and the common voltage ELVSS may be connected to the common voltage supply line 13 to be applied to an opposite electrode of the display element.

The driving voltage supply line 11 may be provided to extend in the x direction under the main display area MDA. The common voltage supply line 13 may have a loop shape of which one side is open, and may surround a portion of the main display area MDA.

Although FIG. 3 illustrates a case where there is one component area CA, a plurality of component areas CA may be provided. In this case, a plurality of component areas CA may be arranged to be spaced apart from each other, a first camera may be arranged corresponding to a component area CA, and a second camera may be arranged corresponding to another component area CA. Alternatively, a camera may be arranged corresponding to a component area CA, and an infrared sensor may be arranged corresponding to another component area CA. The shapes and sizes of the plurality of component areas CA may be different from each other.

Moreover, the component area CA may have a polygonal shape. For example, the component area CA may have an octagonal shape. The component area CA may have any polygonal shape such as a tetragonal shape or a hexagonal shape. The component area CA may be surrounded by the main display area MDA.

Figure 4:
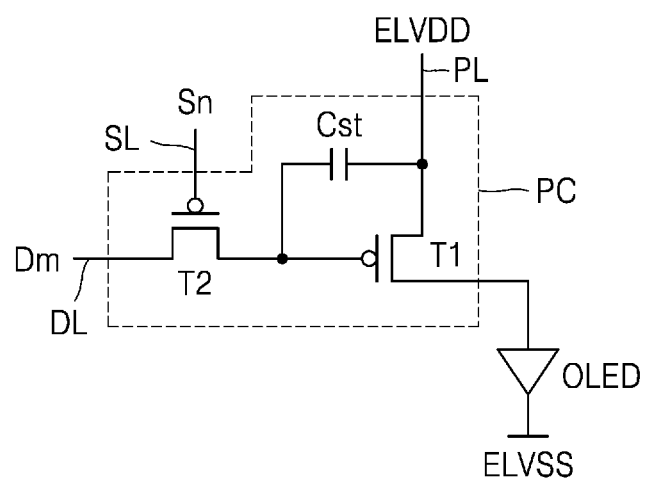
FIGS. 4 and 5 are equivalent circuit diagrams of a pixel circuit driving a subpixel according to some example embodiments.
Figure 5:
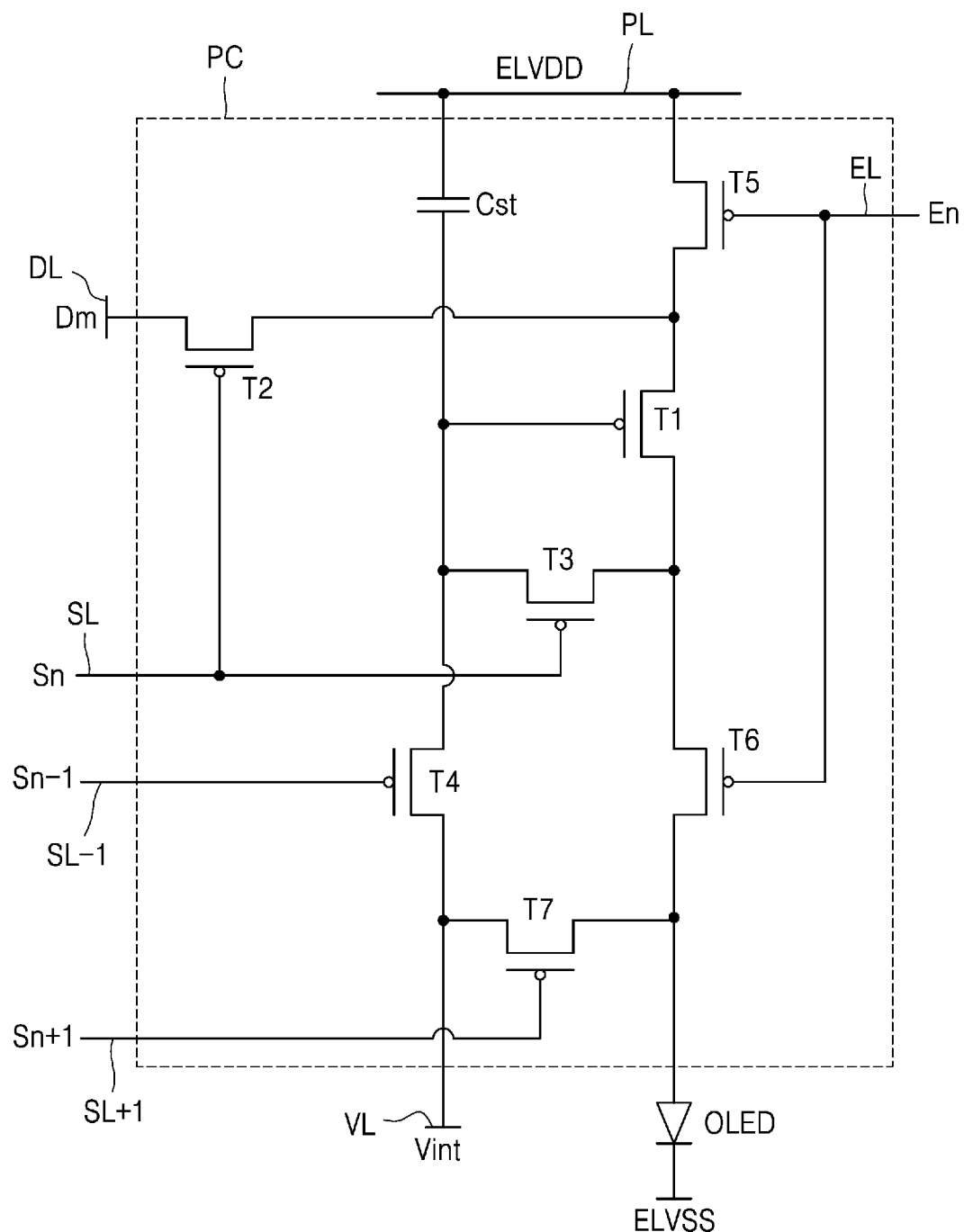

FIGS. 4 and 5 are equivalent circuit diagrams of a pixel circuit driving a subpixel according to some example embodiments.

Referring to FIG. 4, a pixel circuit PC may be connected to an organic light emitting diode OLED to implement light emission of subpixels. The pixel circuit PC may include a driving thin film transistor T1, a switching thin film transistor T2, and a storage capacitor Cst. The switching thin film transistor T2 may be connected to the scan line SL and the data line DL, and may transmit, to the driving thin film transistor T1, a data signal Dm received through the data line DL according to a scan signal Sn received through the scan line SL.

The storage capacitor Cst may be connected to the switching thin film transistor T2 and a driving voltage line PL and may store a voltage corresponding to the difference between a voltage received from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light having a certain luminance according to the driving current.

Although FIG. 4 illustrates that the pixel circuit PC includes two thin film transistors and one storage capacitor, embodiments according to the present disclosure are not limited thereto. For example, according to some example embodiments, the pixel circuit PC may include additional transistors, capacitors, or other electrical components without departing from the spirit and scope of embodiments according to the present disclosure.

Referring to FIG. 5, a pixel circuit PC may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

Although FIG. 5 illustrates that each pixel circuit PC includes signal lines SL, SL−1, SL+1, EL, and DL, an initialization voltage line VL, and a driving voltage line PL, embodiments according to the present disclosure are not limited thereto. According to some example embodiments, at least one of the signal lines, namely, the scan line SL, the previous scan line SL−1, the next scan line SL+1, the emission control line EL, and the data line DL, or/and the initialization voltage line VL may be shared between adjacent pixel circuits.

A drain electrode of the driving thin film transistor T1 may be electrically connected to the organic light emitting diode OLED via the emission control thin film transistor T6. The driving thin film transistor T1 may receive a data signal Dm according to a switching operation of the switching thin film transistor T2 and supply a driving current to the organic light emitting diode OLED.

A gate electrode of the switching thin film transistor T2 may be connected to the scan line SL and a source electrode thereof may be connected to the data line DL. A drain electrode of the switching thin film transistor T2 may be connected to a source electrode of the driving thin film transistor T1 and connected to the driving voltage line PL via the operation control thin film transistor T5.

The switching thin film transistor T2 may be turned on according to the scan signal Sn received through the scan line SL and perform a switching operation of transmitting the data signal Dm received from the data line DL to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1 and connected to a pixel electrode of the organic light emitting diode OLED via the emission control thin film transistor T6. A drain electrode of the compensation thin film transistor T3 may be connected to any one electrode of the storage capacitor Cst, a source electrode of the first initialization thin film transistor T4, and a gate electrode of the driving thin film transistor T1. The compensating thin film transistor T3 may be turned on according to the scan signal Sn received through the scan line SL and connect the gate electrode and the drain electrode of the driving thin film transistor T1 to each other, thus achieving diode-connection of the driving thin film transistor T1.

A gate electrode of the first initialization thin film transistor T4 may be connected to a previous scan line SL−1. A drain electrode of the first initialization thin film transistor T4 may be connected to the initialization voltage line VL. A source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1, to perform an initialization operation of initializing the voltage of the gate electrode of the driving thin film transistor T1 by transmitting an initialization voltage Vint to the gate electrode of the driving thin film transistor T1.

A gate electrode of the operation control thin film transistor T5 may be connected to an emission control line EL. A source electrode of the operation control thin film transistor T5 may be connected to the driving voltage line PL. A drain electrode of the operation control thin film transistor T5 may be connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the organic light emitting diode OLED. The operation control thin film transistor T5 and the emission control thin film transistor T6 may be simultaneously turned on according to an emission control signal En received through the emission control line EL, such that the driving voltage ELVDD may be transmitted to the organic light emitting diode OLED and the driving current may flow through the organic light emitting diode OLED.

A gate electrode of the second initialization thin film transistor T7 may be connected to the next scan line SL+1. A source electrode of the second initialization thin film transistor T7 may be connected to the pixel electrode of the organic light emitting diode OLED. A drain electrode of the second initialization thin film transistor T7 may be connected to the initialization voltage line VL. The second initialization thin film transistor T7 may initialize the pixel electrode of the organic light emitting diode OLED by being turned on according to a next scan signal Sn+1 received through the next scan line SL+1.

Although FIG. 5 illustrates a case where the first initialization thin film transistor T4 and the second initialization thin film transistor T7 are respectively connected to the previous scan line SL−1 and the next scan signal SL+1, embodiments according to the present disclosure are not limited thereto. According to some example embodiments, both the first initialization thin film transistor T4 and the second initialization thin film transistor T7 may be connected to the previous scan line SL−1 to be driven according to the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

An opposite electrode (e.g., a cathode electrode) of the organic light emitting diode OLED may receive a common voltage ELVSS. The organic light emitting diode OLED may receive a driving current from the driving thin film transistor T1 to emit light.

The pixel circuit PC is not limited to the number of components and circuit design of the thin film transistors and storage capacitor described with reference to FIGS. 4 and 5, and the number of electrical components and circuit design thereof may be variously modified without departing from the spirit and scope of embodiments according to the present disclosure.

The pixel circuits PC driving the main subpixel Pm and the auxiliary subpixel Pa may be provided in the same manner or may be provided in different manners. For example, the pixel circuits PC driving the main subpixel Pm and the auxiliary subpixel Pa may be provided as the pixel circuit PC illustrated in FIG. 5. According to some example embodiments, the pixel circuit PC driving the main subpixel Pm may use the pixel circuit PC illustrated in FIG. 5, and the pixel circuit PC driving the auxiliary subpixel Pa may use the pixel circuit PC illustrated in FIG. 4.

Figure 6:
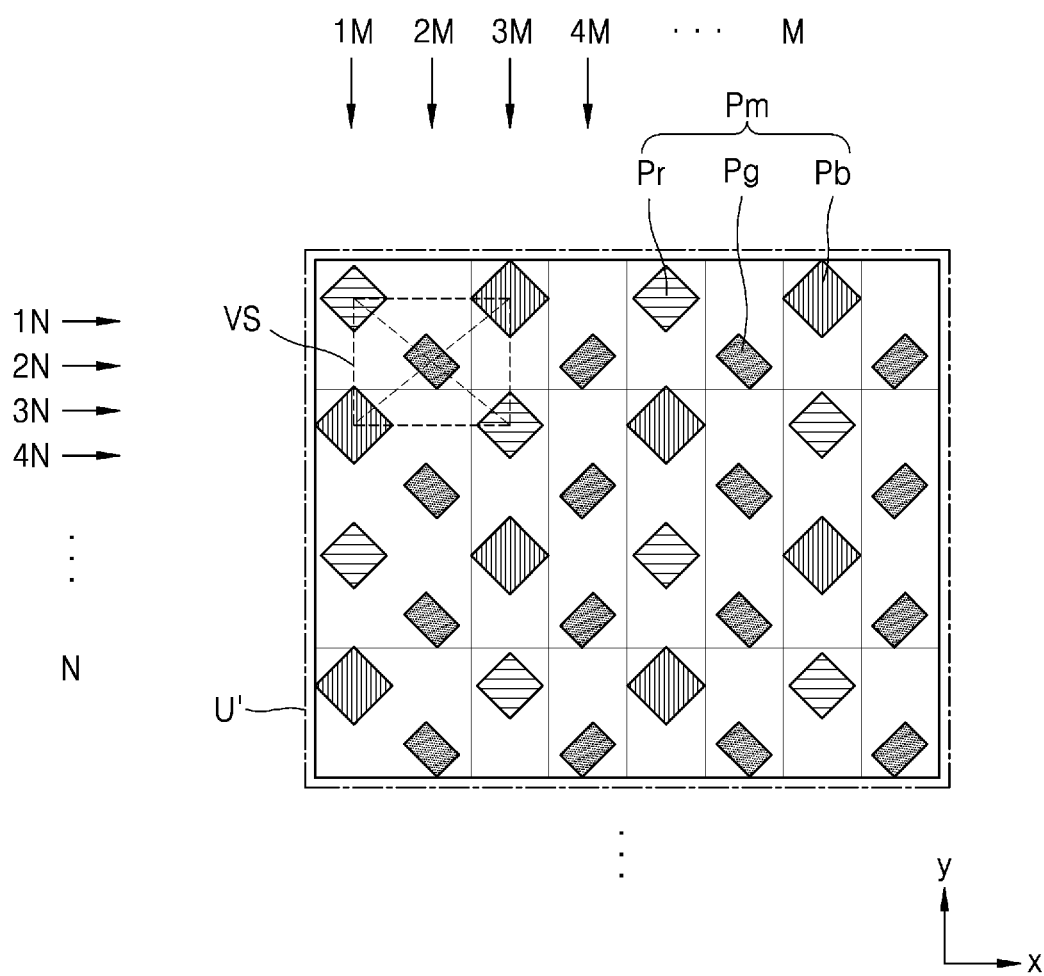
FIG. 6 is an arrangement diagram schematically illustrating a pixel arrangement structure in a main display area according to some example embodiments.

FIG. 6 is an arrangement diagram schematically illustrating a pixel arrangement structure in a main display area according to some example embodiments.

A plurality of main subpixels Pm may be arranged in the main display area MDA. In the specification, a subpixel may refer to an emission area as a minimum unit for implementing an image. When an organic light emitting diode is used as a display element, the emission area may be defined by the opening of a pixel definition layer. This will be described in more detail below.

As in FIG. 6, the main subpixels Pm arranged in the main display area MDA may be arranged in a PenTile structure. The main subpixels Pm may include a first subpixel Pr, a second subpixel Pg, and a third subpixel Pb, and the first subpixel Pr, the second subpixel Pg, and the third subpixel Pb may implement a red color, a green color, and a blue color, respectively.

A plurality of first subpixels Pr and a plurality of third subpixels Pb may be alternately arranged in a first row 1N, a plurality of second subpixels Pg may be arranged at certain intervals in a second row 2N adjacent thereto, and a plurality of third subpixels Pb and a plurality of first subpixels Pr may be alternately arranged in a third row 3N adjacent thereto, a plurality of second subpixels Pg may be arranged at certain intervals in a fourth row 4N adjacent thereto, and this pixel arrangement may be repeated up to an Nth row. In this case, the first subpixel Pr and the third subpixel Pb may be larger than the second subpixel Pg.

The plurality of first subpixels Pr and the plurality of third subpixels Pb arranged in the first row 1N, and the plurality of second subpixels Pg arranged in the second row 2N may be alternately arranged. Thus, a plurality of first subpixels Pr and a plurality of third subpixels Pb may be alternately arranged in a first column 1M, a plurality of second subpixels Pg may be arranged at certain intervals in a second column 2M adjacent thereto, and a plurality of third subpixels Pb and a plurality of first subpixels Pr may be alternately arranged in a third column 3M adjacent thereto, a plurality of second subpixels Pg may be arranged at certain intervals in a fourth column 4M adjacent thereto, and this pixel arrangement may be repeated up to an Mth column.

When this pixel arrangement structure is expressed differently, it may be stated that the first subpixels Pr are arranged at the first and third vertexes facing each other among the vertexes of a virtual square VS having a central point of the second subpixel Pg as a central point thereof and the third subpixels Pb are arranged at the second and fourth vertexes that are the other vertexes thereof. In this case, the virtual square VS may be variously modified into a rectangle, a rhombus, a square, or the like.

This pixel arrangement structure may be referred to as a PenTile matrix structure or a PenTile structure. By applying rendering, in which a color of a pixel is represented by sharing the colors of its adjacent pixels, a high resolution may be obtained via a small number of pixels.

Although FIG. 6 illustrates that a plurality of main subpixels Pm are arranged in a PenTile matrix structure, embodiments according to the present disclosure are not limited thereto. For example, a plurality of main subpixels Pm may be arranged in various forms such as a stripe structure, a mosaic arrangement structure, and a delta arrangement structure.

Figure 7:
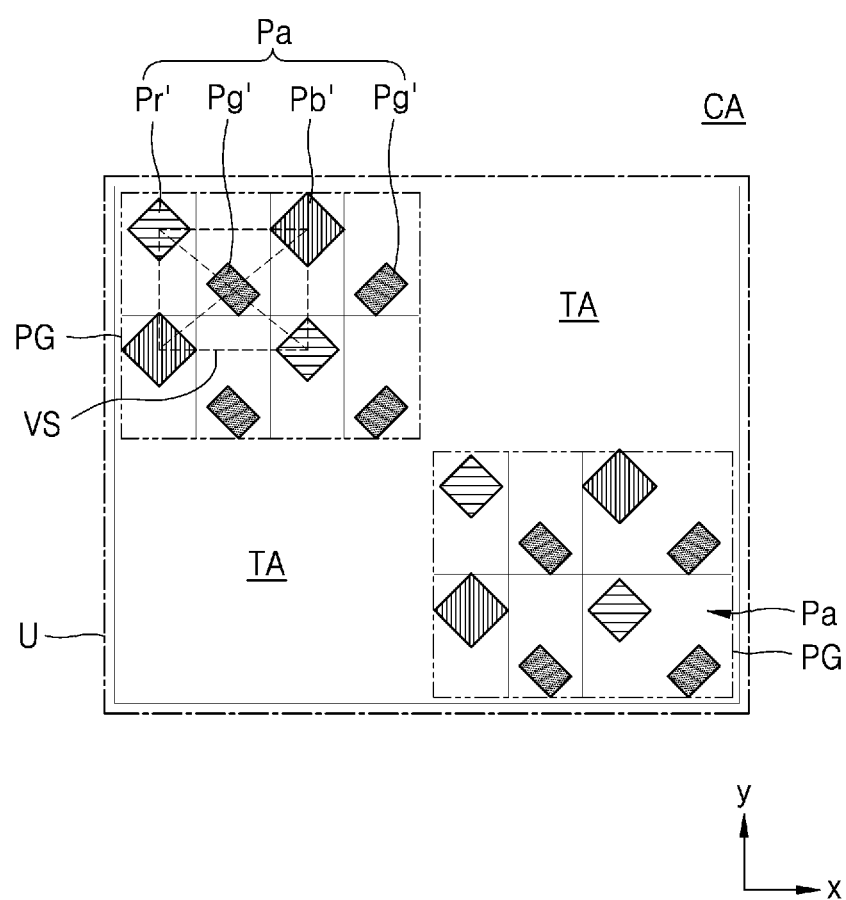
FIGS. 7 and 8 are arrangement diagrams schematically illustrating a pixel arrangement structure in a component area according to some example embodiments.
Figure 8:
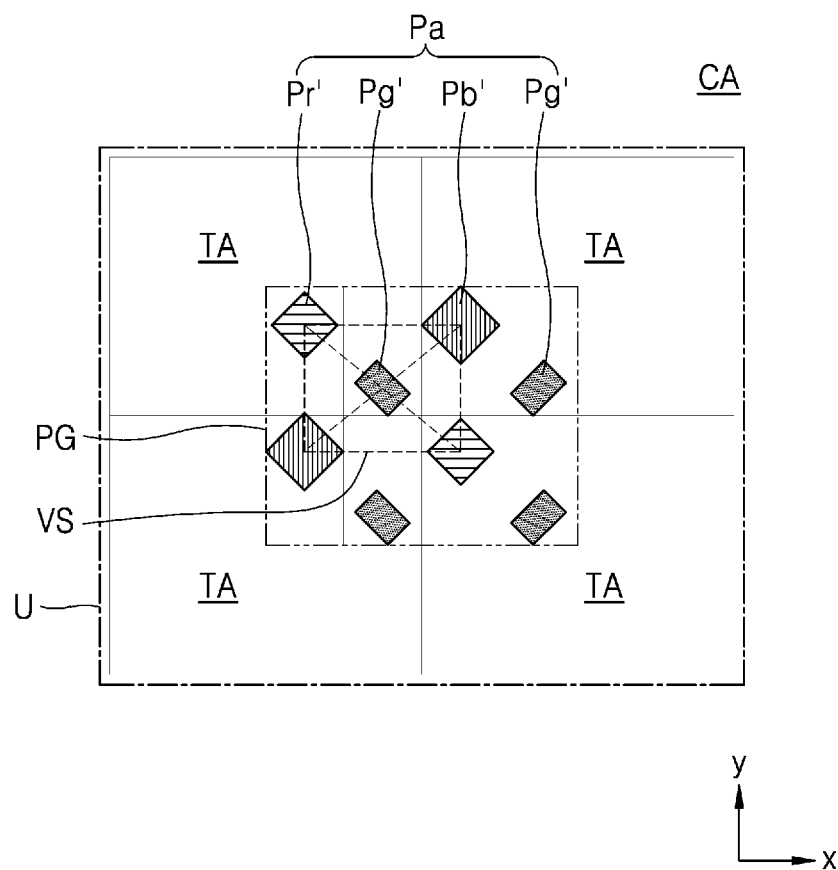

FIGS. 7 and 8 are arrangement diagrams schematically illustrating a pixel arrangement structure in a component area according to some example embodiments.

Referring to FIG. 7, a plurality of auxiliary subpixels Pa may be arranged in the component area CA. Each of the auxiliary subpixels Pa may emit light of any one of red, green, blue, and white.

The component area CA may include a pixel group PG including at least one or more auxiliary subpixels Pa, and a transmission area TA. The pixel group PG and the transmission area TA may be alternately arranged in the x direction and in the y direction and may be arranged, for example, in a grid form. In this case, the component area CA may include a plurality of pixel groups PG and a plurality of transmission areas TA.

The pixel group PG may be defined as a subpixel group in which a plurality of auxiliary subpixels Pa are bound in a preset unit. For example, as illustrated in FIG. 7, one pixel group PG may include eight auxiliary subpixels Pa arranged in a PenTile structure. That is, one pixel group PG may include two first subpixels Pr', four second subpixels Pg', and two third subpixels Pb'.

In the component area CA, a basic unit U in which a certain number of pixel groups PG and a certain number of transmission areas TA are bound may be repeatedly arranged in the x direction and the y direction. In FIG. 7, the basic unit U may have a form in which two pixel groups PG and two transmission areas TA arranged therearound are bound in a square shape. The basic unit U is a division of the repeated form and does not mean a disconnection of the configuration.

A corresponding unit U' having the same area as the basic unit U may be set in the main display area MDA. In this case, the number of main subpixels Pm included in the corresponding unit U' may be greater than the number of auxiliary subpixels Pa included in the basic unit U. That is, the number of auxiliary subpixels Pa included in the basic unit U may be 16 and the number of main subpixels Pm included in the corresponding unit U' may be 32 such that the number of auxiliary subpixels Pa and the number of main subpixels Pm arranged per the same area may be in the ratio of 1:2.

A pixel arrangement structure of the component area CA in which the arrangement structure of auxiliary subpixels Pa is a PenTile structure as in FIG. 7 and the resolution thereof is 1/2 of the resolution of the main display area MDA will be referred to as a 1/2 PenTile structure. The number or arrangement of auxiliary subpixels Pa included in the pixel group PG may be modified according to the resolution of the component area CA.

Referring to FIG. 8, a pixel arrangement structure of the component area CA may be a 1/4 PenTile structure. According to some example embodiments, eight auxiliary subpixels Pa may be arranged in a PenTile structure in a pixel group PG, but only one pixel group PG may be included in a basic unit U. The remaining area of the basic unit U may be provided as a transmission area TA. Thus, the number of auxiliary subpixels Pa and the number of main subpixels Pm arranged per the same area may be in the ratio of 1:4. In this case, one pixel group PG may be surrounded by the transmission area TA.

Although FIGS. 7 and 8 illustrate that a plurality of auxiliary subpixels Pa are arranged in a PenTile matrix structure, embodiments according to the present disclosure are not limited thereto. For example, a plurality of auxiliary subpixels Pa may be arranged in various forms such as a stripe structure, a mosaic arrangement structure, and a delta arrangement structure.

Also, although FIGS. 7 and 8 illustrate that the size of the auxiliary subpixel Pa is equal to the size of the main subpixel Pm of FIG. 6, embodiments according to the present disclosure are not limited thereto. The size of the auxiliary subpixel Pa may be greater than the size of the main subpixel Pm emitting the same color. For example, the size of the third subpixel Pb of the auxiliary subpixel Pa may be greater than the size of the third subpixel Pb' of the main subpixel Pm. The difference in the size therebetween may be designed considering the difference in the brightness and/or the resolution between the component area CA and the main display area MDA.

Figure 9:
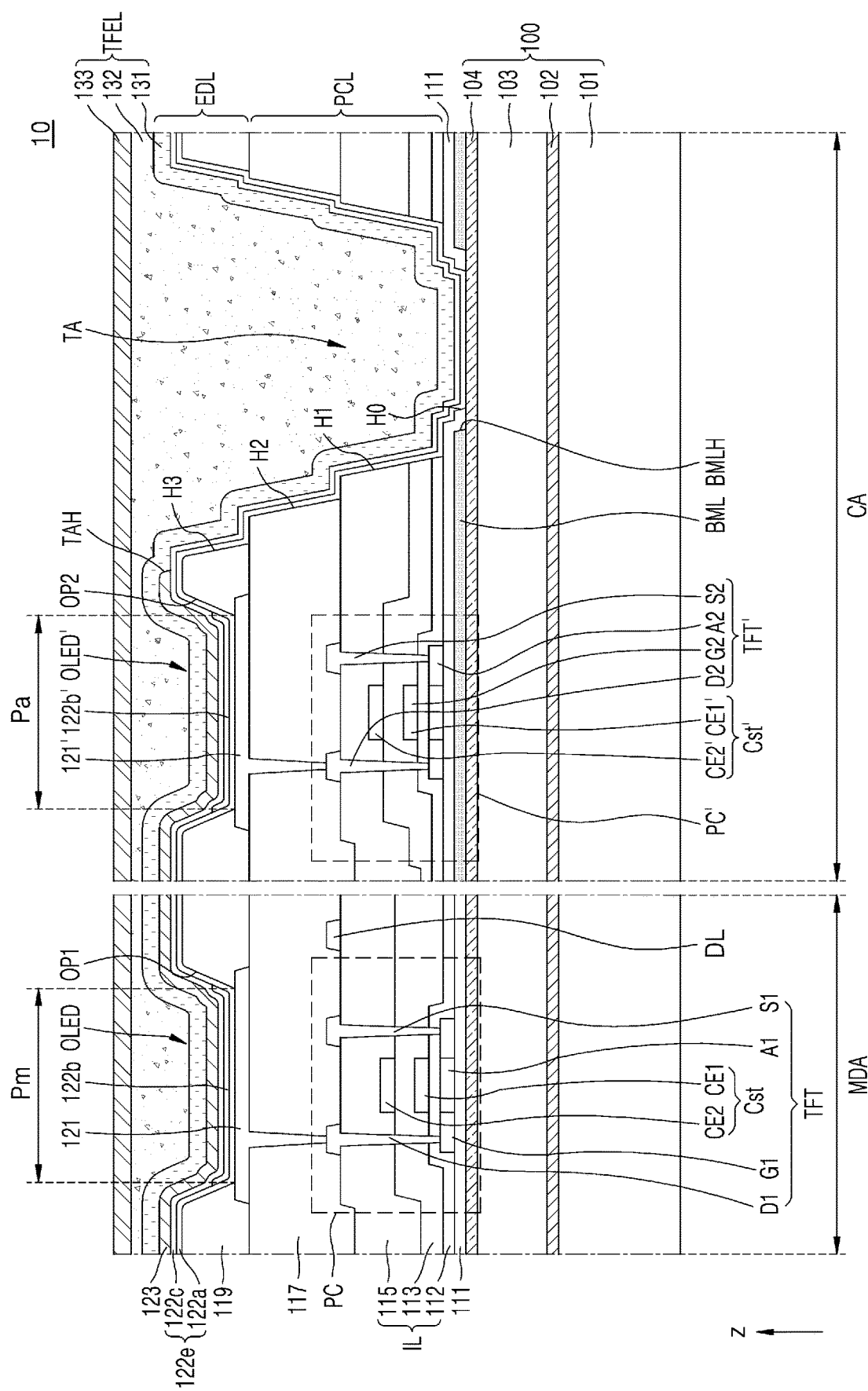
FIG. 9 is a cross-sectional view illustrating a portion of a display panel according to some example embodiments, which schematically illustrates a main display area and a component area.

FIG. 9 is a cross-sectional view illustrating a portion of a display panel according to some example embodiments, which schematically illustrates a main display area and a component area.

Referring to FIG. 9, a display panel 10 may include a main display area MDA and a component area CA. A main subpixel Pm may be arranged in the main display area MDA, and the component area CA may include an auxiliary subpixel Pa and a transmission area TA. A main pixel circuit PC including a main thin film transistor TFT and a main storage capacitor Cst, and a main organic light emitting diode OLED as a display element connected to the main pixel circuit PC may be arranged in the main display area MDA. An auxiliary pixel circuit PC' including an auxiliary thin film transistor TFT' and an auxiliary storage capacitor Cst', and an auxiliary organic light emitting diode OLED' as a display element connected to the auxiliary pixel circuit PC' may be arranged in the component area CA.

According to some example embodiments, an organic light emitting diode is used as a display element; however, in other embodiments, an inorganic light emitting device, or a quantum dot light emitting device may be used as a display element.

Hereinafter, a structure in which the components included in the display panel 10 are stacked will be described. The display panel 10 may include a stack of a substrate 100, a buffer layer 111, a circuit layer PCL, a display element layer EDL, and a thin film encapsulation layer TFEL as an encapsulation member.

The substrate 100 may include an insulating material such as a polymer resin. The substrate 100 may include a flexible substrate capable of bending, folding, rolling, or the like.

According to some example embodiments, the substrate 100 may include a first layer 101, a first barrier layer 102, a second layer 103, and a second barrier layer 104 that are sequentially stacked.

The first layer 101 and the second layer 103 may include a polymer resin having high heat resistance. For example, the first layer 101 and the second layer 103 may include at least one of polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, or polyaryleneethersulfone. For example, the first layer 101 and the second layer 103 may include polyimide. The first barrier layer 102 and the second barrier layer 104 may block the penetration of external air.

The buffer layer 111 may be located on the substrate 100 and may reduce or prevent infiltration of a foreign material, moisture, or ambient air from below the substrate 100 and may provide a flat surface on the substrate 100. The buffer layer 111 may include an inorganic material, such as an oxide or nitride, an organic material, or an organic-inorganic composite material, and may have a single layer structure or a multilayer structure including an inorganic material or an organic material. According to some example embodiments, the buffer layer 111 may include silicon oxide ($SiO_x$) or silicon nitride ($SiN_x$). According to some example embodiments, the buffer layer 111 may include a stack of silicon oxide ($SiO_x$) and silicon nitride ($SiN_x$).

In the component area CA, a bottom metal layer BML may be arranged between the substrate 100 and the buffer layer 111. The bottom metal layer BML may be located below the auxiliary pixel circuit PC' and may prevent or reduce instances of characteristics of the auxiliary thin film transistor TFT' degrading due to light emitted from, for example, a component. Also, the bottom metal layer BML may prevent or reduce instances of the light emitted from the component or the like or directed to the component being diffracted through a narrow gap between the lines connected to the auxiliary pixel circuit PC'. The bottom metal layer BML may not be in the transmission area TA.

A bias voltage may be applied to the bottom metal layer BML. By receiving the bias voltage, the bottom metal layer BML may significantly reduce the probability of occurrence of an electrostatic discharge. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or a multiple layer including the above materials.

The circuit layer PCL may be arranged over the buffer layer 111 and may include pixel circuits PC and PC', a first insulating layer 112, a second insulating layer 113, a third insulating layer 115, and a first planarization layer 117. The main pixel circuit PC may include a main thin film transistor TFT and a main storage capacitor Cst, and the auxiliary pixel circuit PC' may include an auxiliary thin film transistor TFT' and an auxiliary storage capacitor Cst'.

The main thin film transistor TFT and/or the auxiliary thin film transistor TFT' may be above the buffer layer 111. The main thin film transistor TFT may include a first semiconductor layer A1, a first gate electrode G1, a first source electrode S1, and a first drain electrode D1, and the auxiliary thin film transistor TFT' may include a second semiconductor layer A2, a second gate electrode G2, a second source electrode S2, and a second drain electrode D2. The main thin film transistor TFT may be connected to the main organic light emitting diode OLED and may drive the main organic light emitting diode OLED. The auxiliary thin film transistor TFT' may be connected to the auxiliary organic light emitting diode OLED' to drive the auxiliary organic light emitting diode OLED'.

The first semiconductor layer A1 and the second semiconductor layer A2 may be arranged over the buffer layer 111 and may include polysilicon. According to some example embodiments, the first semiconductor layer A1 and the second semiconductor layer A2 may include amorphous silicon. According to some example embodiments, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 and the second semiconductor layer A2 may include a channel area and a source area and a drain area that are doped with dopants.

The second semiconductor layer A2 may overlap the bottom metal layer BML with the buffer layer 111 therebetween. According to some example embodiments, the width of the second semiconductor layer A2 may be less than the width of the bottom metal layer BML, and thus, the second semiconductor layer A2 may entirely overlap the bottom metal layer BML in the direction perpendicular to the substrate 100.

The first insulating layer 112 may be provided to cover the first semiconductor layer A1 and the second semiconductor layer A2. The first insulating layer 112 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$). The first insulating layer 112 may include a single layer or a multiple layer including the above inorganic insulating material.

The first gate electrode G1 and the second gate electrode G2 may be arranged over the first insulating layer 112 to respectively overlap the first semiconductor layer A1 and the second semiconductor layer A2. The first gate electrode G1 and the second gate electrode G2 may include molybdenum (Mo), aluminum (Al), copper (Cu), titanium (Ti), or the like and may include a single layer or a multiple layer. According to some example embodiments, the first gate electrode G1 and the second gate electrode G2 may include a molybdenum (Mo) single layer.

The second insulating layer 113 may be provided to cover the first gate electrode G1 and the second gate electrode G2. The second insulating layer 113 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$). The second insulating layer 113 may include a single layer or a multiple layer including the above inorganic insulating material.

A first upper electrode CE2 of the main storage capacitor Cst and a second upper electrode CE2' of the auxiliary storage capacitor Cst' may be arranged over the second insulating layer 113.

In the main display area MDA, the first upper electrode CE2 may overlap the first gate electrode G1 arranged thereunder. The first gate electrode G1 and the first upper electrode CE2 overlapping each other with the second insulating layer 113 therebetween may constitute the main storage capacitor Cst. According to some example embodiments, the first gate electrode G1 may be a first lower electrode CE1 of the main storage capacitor Cst. According to some example embodiments, the first lower electrode CE1 of the main storage capacitor Cst may be an independent component separate from the first gate electrode G1 of the main thin film transistor TFT.

In the component area CA, the second upper electrode CE2' may overlap the second gate electrode G2 arranged thereunder. The second gate electrode G2 and the second upper electrode CE2' overlapping each other with the second insulating layer 113 therebetween may constitute the auxiliary storage capacitor Cst'. According to some example embodiments, the second gate electrode G2 may be a second lower electrode CE1' of the auxiliary storage capacitor Cst'. According to some example embodiments, the second lower electrode CE1' of the auxiliary storage capacitor Cst' may be an independent component separate from the second gate electrode G2 of the auxiliary thin film transistor TFT'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multiple layer of the above material.

The third insulating layer 115 may be provided to cover the first upper electrode CE2 and the second upper electrode CE2'. The third insulating layer 115 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$).

When the first insulating layer 112, the second insulating layer 113, and the third insulating layer 115 are collectively referred to as an inorganic insulating layer IL, the inorganic insulating layer IL may include a first hole H1 corresponding to the transmission area TA. The first hole H1 may expose a portion of the top surface of the substrate 100 or the buffer layer 111. The first hole H1 may overlap an opening of the first insulating layer 112, an opening of the second insulating layer 113, and an opening of the third insulating layer 115 formed to correspond to the transmission area TA. These openings may be individually formed through separate processes, or may be simultaneously formed through the same process. When the openings are formed in separate processes, the inner surface of the first hole H1 may not be smooth and may have a stair-shaped step.

Moreover, according to some example embodiments, the buffer layer 111 may include a buffer hole H0 corresponding to the transmission area TA. The buffer hole H0 may expose a portion of the top surface of the substrate 100. The area of the buffer-hole H0 may be less than the area of the first hole H1. Because the buffer layer 111 and the inorganic insulating layer IL include the first and buffer holes H1 and H0 corresponding to the transmission area TA, the light transmittance of the component area CA may be improved.

The data line DL, the source electrodes S1 and S2, and the drain electrodes D1 and D2 may be arranged over the third insulating layer 115. The data line DL, the source electrodes S1 and S2, and the drain electrodes D1 and D2 may include a conductive material including molybdenum (Mo), aluminum (Al), copper (Cu), titanium (Ti), or the like and may include a single layer or a multiple layer including the above material. For example, the data line DL, the source electrodes S1 and S2, and the drain electrodes D1 and D2 may include a multilayer structure of titanium (Ti)/aluminum (AD/titanium (Ti).

The first planarization layer 117 may be arranged to cover the data line DL, the source electrodes S1 and S2, and the drain electrodes D1 and D2. The first planarization layer 117 may have a flat top surface such that a first pixel electrode 121 and a second pixel electrode 121' arranged thereover may be flat.

The first planarization layer 117 may include an organic material or an inorganic material and may have a single-layer structure or a multilayer structure. The first planarization layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. Moreover, the first planarization layer 117 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and hafnium oxide ($HfO_2$), or zinc oxide ($ZnO_2$). When the first planarization layer 117 is formed, after a layer is formed, chemical mechanical polishing may be performed on a top surface of the layer to provide a flat top surface.

The first planarization layer 117 may include a second hole H2 corresponding to the transmission area TA. The second hole H2 may overlap the first hole H1. FIG. 9 illustrates that the second hole H2 is larger than the first hole H1. According to some example embodiments, the first planarization layer 117 may be provided to cover the edge of the first hole H1 of the inorganic insulating layer IL such that the area of the second hole H2 may be less than the area of the first hole H1.

The first planarization layer 117 may include a via hole for exposing any one of the first source electrode S1 and the first drain electrode D1 of the main thin film transistor TFT, and the first pixel electrode 121 may be electrically connected to the main thin film transistor TFT by contacting the first source electrode S1 or the first drain electrode D1 through the via hole. Also, the first planarization layer 117 may include a via hole for exposing any one of the second source electrode S2 and the second drain electrode D2 of the auxiliary thin film transistor TFT', and the second pixel electrode 121' may be electrically connected to the auxiliary thin film transistor TFT' by contacting the second source electrode S2 or the second drain electrode D2 through the via hole.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure including layers formed of ITO, IZO, ZnO, or $In_2O_3$ over/under the reflection layer. In this case, the first pixel electrode 121 and the second pixel electrode 121' may have a structure in which indium tin oxide (ITO)/silver (Ag)/indium tin oxide (ITO) are sequentially stacked.

A pixel definition layer 119 may cover the edges of the first pixel electrode 121 and the second pixel electrode 121' over the first planarization layer 117 and may include a first opening OP1 and a second opening OP2 for exposing at least a portion of the first pixel electrode 121 and the second pixel electrode 121'. The first opening OP1 and the second opening OP2 may define the emission areas of the organic light emitting diodes OLED and OLED', that is, the sizes and shapes of the subpixels Pm and Pa.

The pixel definition layer 119 may increase the distance between the edge of the pixel electrodes 121 and 121' and an opposite electrode 123 over the pixel electrodes 121 and 121' to prevent an arc or the like from occurring at the edge of the pixel electrodes 121 and 121'. The pixel definition layer 119 may be formed of an organic insulating material such as polyimide, polyamide, acrylic resin, benzocyclobutene, hexamethyldisiloxane (HMDSO), or phenol resin by spin coating or the like. Also, according to some example embodiments, a spacer may be further provided over the pixel definition layer 119.

The pixel definition layer 119 may include a third hole H3 corresponding to the transmission area TA. The third hole H3 may overlap the first hole H1 and the second hole H2. The light transmittance in the transmission area TA may be improved by the first hole H1 to the third hole H3 located in the transmission area TA. A portion of the opposite electrode 123 described below may be arranged at the inner surface of the first hole H1 to the third hole H3.

A first emission layer 122b and a second emission layer 122b' may be arranged inside the first opening OP1 and the second opening OP2 of the pixel definition layer 119 to respectively correspond to the first pixel electrode 121 and the second pixel electrode 121'. The first emission layer 122b and the second emission layer 122b' may include a high molecular weight organic material or a low molecular weight organic material and may emit red, green, blue, or white light.

An organic functional layer 122e may be arranged over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged under the first emission layer 122b and the second emission layer 122b'. The first functional layer 122a may include a single layer or a multiple layer including an organic material. The first functional layer 122a may include a hole transport layer (HTL) having a single-layer structure. Alternatively, the first functional layer 122a may include a hole injection layer (HIL) and an HTL. The first functional layer 122a may be integrally provided to correspond to the main and auxiliary organic light emitting diodes OLED and OLED' included in the main display area MDA and the component area CA.

The second functional layer 122c may be arranged over the first emission layer 122b and the second emission layer 122b'. The second functional layer 122c may include a single layer or a multiple layer including an organic material. The second functional layer 122c may include an electron transport layer (ETL) and/or an electron injection layer (EIL). The second functional layer 122c may be integrally provided to correspond to the organic light emitting diodes OLED and OLED' included in the main display area MDA and the component area CA.

The opposite electrode 123 may be arranged over the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer, such as ITO, IZO, ZnO, or $In_2O_3$, on the (semi)transparent layer including any of the above materials. The opposite electrode 123 may be integrally formed to correspond to the organic light emitting diodes OLED and OLED' included in the main display area MDA and the component area CA.

The layers from the first pixel electrode 121 to the opposite electrode 123 formed in the main display area MDA may constitute the main organic light emitting diode OLED. The layers from the second pixel electrode 121' to the opposite electrode 123 formed in the component area CA may constitute the auxiliary organic light emitting diode OLED'.

A capping layer including an organic material may be formed over the opposite electrode 123. The capping layer may be provided to protect the opposite electrode 123 and improve light extraction efficiency. The capping layer may include an organic material having a higher refractive index than the opposite electrode 123.

The opposite electrode 123 may include a transmission hole TAH corresponding to the transmission area TA. The transmission hole TAH corresponding to the transmission area TA may be understood as the transmission hole TAH overlapping the transmission area TA. FIG. 9 illustrates that the area of the transmission hole TAH is more than the area of the first hole H1 formed in the inorganic insulating layer IL. However, embodiments according to the present disclosure are not limited thereto. According to some example embodiments, the area of the transmission hole TAH may be less than or equal to the area of the first hole H1.

Due to the transmission hole TAH, a portion of the opposite electrode 123 may not be in the transmission area TA, and accordingly, the light transmittance in the transmission area TA may be significantly improved. The opposite electrode 123 including the transmission hole TAH may be formed in various ways. According to some example embodiments, after a material used to form the opposite electrode 123 is deposited on the entire surface of the substrate 100, a portion of the deposited material that corresponds to the transmission area TA may be removed through laser lift off, and thus the opposite electrode 123 having the transmission hole TAH may be formed. According to some example embodiments, the opposite electrode 123 having the transmission hole TAH may be formed by metal self patterning (MSP). According to some example embodiments, the opposite electrode 123 including the transmission hole TAH may be formed by depositing the opposite electrode 123 by using a fine metal mask (FMM).

The bottom metal layer BML of the component area CA may be provided to correspond to the entire component area CA. In this case, the bottom metal layer BML may include a bottom hole BMLH overlapping the transmission area TA. According to some example embodiments, the shape and size of the transmission area TA may be defined by the shape and size of the bottom hole BMLH.

The thin film encapsulation layer TFEL as an encapsulation member ENCM may be arranged over the display element layer EDL of the display panel 10. That is, the organic light emitting diodes OLED and OLED' may be encapsulated by the thin film encapsulation layer TFEL. The thin film encapsulation layer TFEL may be arranged over the opposite electrode 123. The thin film encapsulation layer TFEL may prevent external moisture or foreign substances from penetrating into the organic light emitting diodes OLED and OLED'.

The thin film encapsulation layer TFEL may include at least one inorganic encapsulation layer and at least one organic encapsulation layer, and in this regard, FIG. 9 illustrates a structure in which a first inorganic encapsulation layer 131, an organic encapsulation layer 132, and a second inorganic encapsulation layer 133 are stacked. According to some example embodiments, the number of organic encapsulation layers, the number of inorganic encapsulation layers, and the stacking order thereof may be changed.

The first inorganic encapsulation layer 131 and the second inorganic encapsulation layer 133 may include one or more inorganic insulating materials such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$) and may be formed by chemical vapor deposition (CVD) or the like. The organic encapsulation layer 132 may include a polymer-based material. Examples of the polymer-based material may include silicone resin, acrylic resin, epoxy resin, polyimide, polyethylene, or the like.

The first inorganic encapsulation layer 131, the organic encapsulation layer 132, and the second inorganic encapsulation layer 133 may be integrally formed to cover the main display area MDA and the component area CA. Accordingly, the first inorganic encapsulation layer 131 and the organic encapsulation layer 132 may be arranged in the first hole H1 of the inorganic insulating layer IL. Also, the first inorganic encapsulation layer 131 and the organic encapsulation layer 132 may be arranged in the second hole H2 of the first planarization layer 117 and in the third hole H3 of the pixel definition layer 119.

Figure 10:
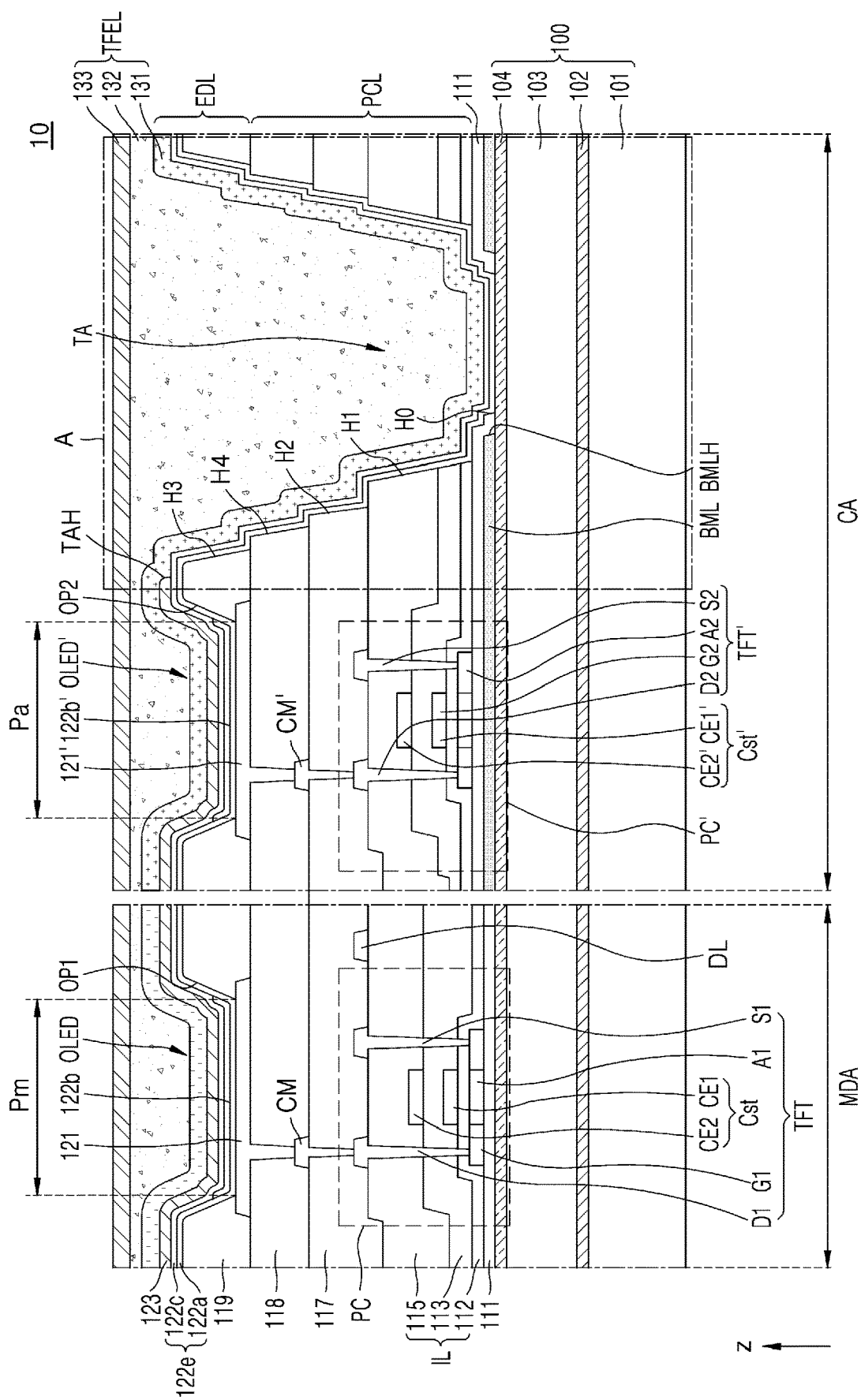
FIG. 10 is a cross-sectional view illustrating a portion of a display panel according to some example embodiments, which schematically illustrates a main display area and a component area.

FIG. 10 is a cross-sectional view illustrating a portion of a display panel according to some example embodiments, which schematically illustrates a main display area and a component area. The embodiments described with respect to FIG. 10 may be different from the embodiments described with respect to FIG. 9 in that a second planarization layer and contact electrodes CM and CM' are further provided between the first planarization layer 117 and the pixel definition layer 119. In FIG. 10, like reference numerals as those in FIG. 9 denote like members, and thus, some redundant descriptions thereof may be omitted for conciseness.

Referring to FIG. 10, a second planarization layer 118 may be arranged over the first planarization layer 117. The second planarization layer 118 may have a flat top surface such that a first pixel electrode 121 and a second pixel electrode 121' arranged thereover may be flat. According to some example embodiments, the second planarization layer 118 may include the same material as the first planarization layer 117. According to some example embodiments, the second planarization layer 118 may include a different material than the first planarization layer 117. Because the second planarization layer 118 is further provided over the first planarization layer 117, there may be relatively high integration.

The second planarization layer 118 may include a fourth hole H4 corresponding to the transmission area TA. The fourth hole H4 may overlap the first hole H1 and the second hole H2. FIG. 10 illustrates that the fourth hole H4 is larger than the first hole H1 and the second hole H2. According to some example embodiments, the second planarization layer 118 may be provided to cover the edge of the first hole H1 of the inorganic insulating layer IL or the edge of the second hole H2 of the first planarization layer 117 such that the area of the fourth hole H4 may be less than the area of the first hole H1 or the second hole H2.

Contact electrodes CM and CM' may be arranged over the first planarization layer 117. The first pixel electrode 121 and the second pixel electrode 121' may be respectively electrically connected to the main thin film transistor TFT and the auxiliary thin film transistor TFT' through the contact electrodes CM and CM' arranged over the first planarization layer 117.

Figure 11:
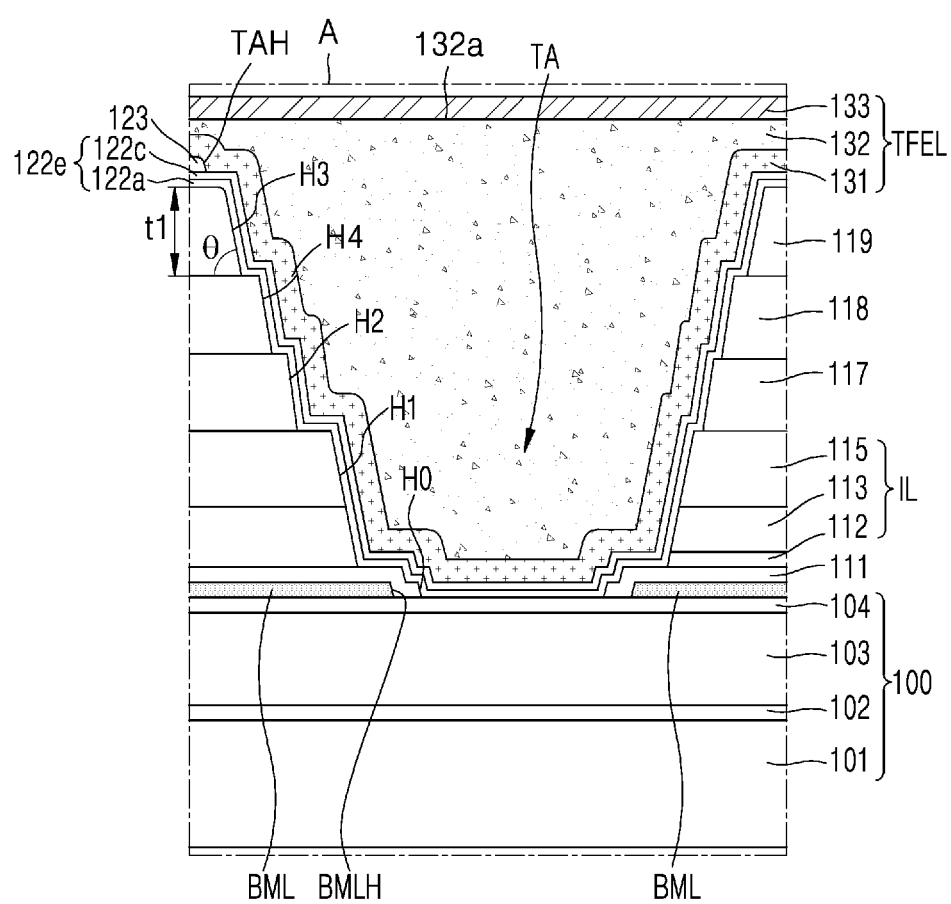
FIG. 11 is a cross-sectional view illustrating a portion of a display panel according to some example embodiments, which corresponds to an enlarged cross-sectional view of region A of FIG. 10.

FIG. 11 is a cross-sectional view illustrating a portion of a display panel according to some example embodiments, which corresponds to an enlarged cross-sectional view of region A of FIG. 10.

Referring to FIG. 11, the inorganic insulating layer IL, the first planarization layer 117, the second planarization layer 118, and the pixel definition layer 119 may respectively include the first hole H1 to the fourth hole H4 corresponding to the transmission area TA. Because the first hole H1 to the fourth hole H4 are provided to correspond to the transmission area TA, the light transmittance of the component area CA may be improved; however, a step may occur between the transmission area TA, the main display area MDA, and the component area CA excluding the transmission area TA due to the first hole H1 to the fourth hole H4 provided to correspond to the transmission area TA and thus the flatness of the thin film encapsulation layer TFEL arranged over the transmission area TA may be degraded. For example, as the flatness of the organic encapsulation layer 132 of the thin film encapsulation layer TFEL arranged over the transmission area TA degrades, the component 40 arranged under the display panel corresponding to the component area CA may be out of focus.

According to some example embodiments, the pixel definition layer 119 may be arranged over the second planarization layer 118 and may have a thickness t1 of about 1.3 μm to about 2 μm from the upper surface of the second planarization layer 118. When the pixel definition layer 119 has a thickness of less than about 1.3 μm from the upper surface of the second planarization layer 118, the pixel definition layer 119 may fail to maintain its thickness and area and thus may collapse. Also, when the pixel definition layer 119 has a thickness of more than about 2 μm from the upper surface of the second planarization layer 118, the spreadability of the organic material constituting the organic encapsulation layer 132 of the thin film encapsulation layer TFEL may be suppressed due to the thickness of the pixel definition layer 119 and thus the organic material may not flow toward the transmission area TA and thus the flatness of the thin film encapsulation layer TFEL arranged over the transmission area TA may degrade. Thus, because the pixel definition layer 119 has a thickness t1 of about 1.3 μm to about 2 μm from the upper surface of the second planarization layer 118, the pixel definition layer 119 may be prevented from collapsing and the spreadability of the organic material constituting the organic encapsulation layer 132 of the thin film encapsulation layer TFEL may be improved to improve the flatness of the thin film encapsulation layer TFEL arranged over the transmission area TA. That is, as the pixel definition layer 119 has a thickness t1 of about 1.3 μm to about 2 μm from the upper surface of the second planarization layer 118, the organic material constituting the organic encapsulation layer 132 of the thin film encapsulation layer TFEL may flow better toward the transmission area TA and thus the flatness of the thin film encapsulation layer TFEL arranged over the transmission area TA may be improved.

Also, when a spacer is further provided over the pixel definition layer 119, the sum of the thickness of the pixel definition layer 119 and the thickness of the spacer may be a thickness t1 of about 1.3 μm to about 2 μm from the upper surface of the second planarization layer 118.

According to some example embodiments, the pixel definition layer 119 may be arranged over the second planarization layer 118, and the side surface of the pixel definition layer 119 may form an angle θ of about 30 degrees to about 40 degrees with respect to the upper surface of the second planarization layer 118. When the angle between the side surface of the pixel definition layer 119 and the upper surface of the second planarization layer 118 is less than about 30 degrees, the pixel definition layer 119 may fail to maintain its thickness and area and thus may collapse. Also, when the angle between the side surface of the pixel definition layer 119 and the upper surface of the second planarization layer 118 is more than about 40 degrees, the spreadability of the organic material constituting the organic encapsulation layer 132 of the thin film encapsulation layer TFEL may be suppressed and thus the organic material may not flow toward the transmission area TA and thus the flatness of the thin film encapsulation layer TFEL arranged over the transmission area TA may degrade. Thus, because the angle between the side surface of the pixel definition layer 119 and the upper surface of the second planarization layer 118 is about 30 degrees to about 40 degrees, the pixel definition layer 119 may be prevented from collapsing and the spreadability of the organic material constituting the organic encapsulation layer 132 of the thin film encapsulation layer TFEL may be improved to improve the flatness of the thin film encapsulation layer TFEL arranged over the transmission area TA. Thus, as the angle between the side surface of the pixel definition layer 119 and the upper surface of the second planarization layer 118 is about 30 degrees to about 40 degrees, the spreadability of the organic material constituting the organic encapsulation layer 132 of the thin film encapsulation layer TFEL may be improved and thus the flatness of the thin film encapsulation layer TFEL arranged over the transmission area TA may be improved.

Because the pixel definition layer 119 according to some example embodiments is arranged over the first pixel electrode 121 and the second pixel electrode 121', the angle between the side surface of the pixel definition layer 119 and the upper surface of the first pixel electrode 121 and the second pixel electrode 121' may also be about 30 degrees to about 40 degrees.

According to some example embodiments, in order to secure the flatness of the thin film encapsulation layer TFEL over the transmission area TA, that is, in order to secure the flatness of the organic encapsulation layer 132 over the transmission area TA, a larger amount of organic material for forming the organic encapsulation layer 132 may be applied in the transmission area TA than in the main display area MDA and the component area CA excluding the transmission area TA. Also, an organic material for forming the organic encapsulation layer 132 may be applied by a larger area in the transmission area TA than in the main display area MDA and the component area CA excluding the transmission area TA.

According to some example embodiments, the organic encapsulation layer 132 over the transmission area TA may have an upper surface 132a, which is flat. That is, the upper surface 132a of the organic encapsulation layer 132 over the transmission area TA may be flat. Because the upper surface 132a of the organic encapsulation layer 132 over the transmission area TA is flat, the component 40 arranged under the display panel 10 corresponding to the component area CA may be prevented from being out of focus.

Figure 12:
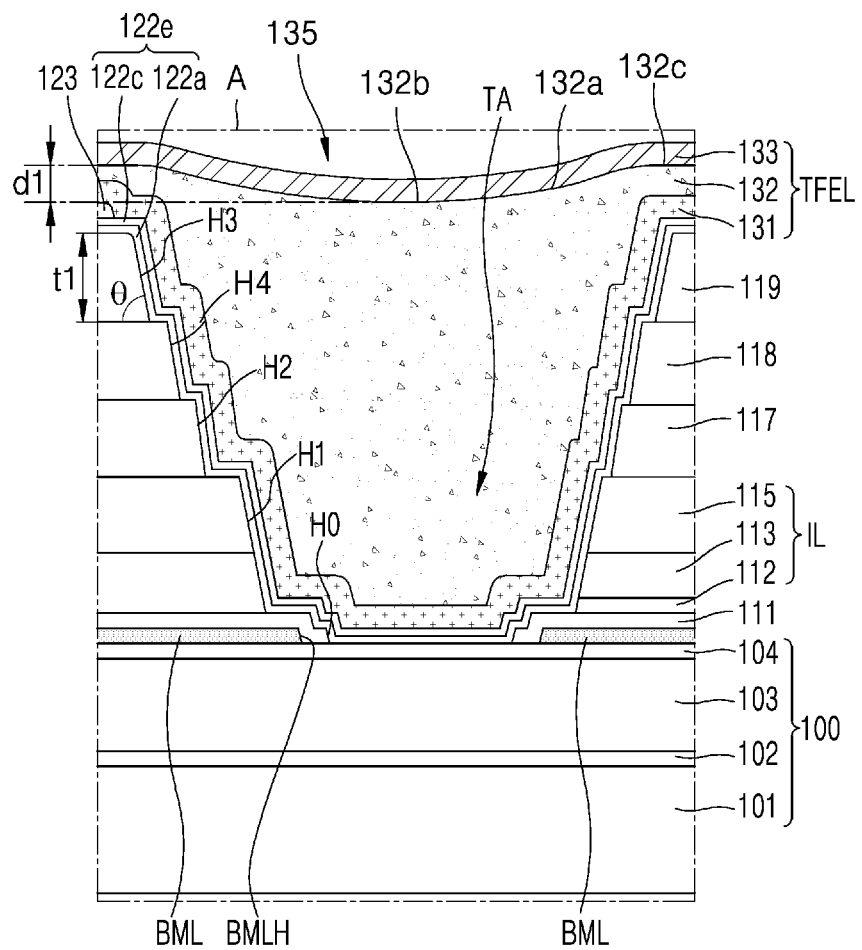
FIG. 12 is a cross-sectional view illustrating a portion of a display panel according to some example embodiments, which corresponds to an enlarged cross-sectional view of region A of FIG. 10.

FIG. 12 is a cross-sectional view illustrating a portion of a display panel according to some example embodiments, which corresponds to an enlarged cross-sectional view of region A of FIG. 10. The embodiments described with respect to FIG. 12 may be different from the embodiments described with respect to FIG. 11 in that an organic encapsulation layer 132 over the transmission area TA includes a concave portion 135. In FIG. 12, like reference numerals as those in FIG. 11 denote like members, and thus, some redundant descriptions thereof may be omitted for conciseness.

Referring to FIG. 12, an organic encapsulation layer 132 over the transmission area TA may include a concave portion 135. An upper surface 132a of the organic encapsulation layer 132 over the transmission area TA may be concave.

According to some example embodiments, a distance d1 from a bottom surface 132b of the upper surface 132a of the organic encapsulation layer 132 over the transmission area TA to a top surface 132c of the upper surface 132a of the organic encapsulation layer 132 may be more than about 0 μm and less than or equal to about 2 μm. When the distance d1 from the bottom surface 132b of the upper surface 132a of the organic encapsulation layer 132 over the transmission area TA to the top surface 132c of the upper surface 132a of the organic encapsulation layer 132 is more than about 2 μm, the component 40 arranged under the display panel 10 corresponding to the component area CA may be out of focus. Also, when the distance d1 from the bottom surface 132b of the upper surface 132a of the organic encapsulation layer 132 over the transmission area TA to the top surface 132c of the upper surface 132a of the organic encapsulation layer 132 is about 0 μm, the upper surface 132a of the organic encapsulation layer 132 may not be considered as being concave. Thus, because the distance d1 from the bottom surface 132b of the upper surface 132a of the organic encapsulation layer 132 over the transmission area TA to the top surface 132c of the upper surface 132a of the organic encapsulation layer 132 is more than about 0 μm and less than or equal to 2 μm, the component 40 arranged under the display panel 10 corresponding to the component area CA may be prevented from being out of focus.

Because the organic encapsulation layer 132 over the transmission area TA includes the concave portion 135 and thus the upper surface 132a of the organic encapsulation layer 132 over the transmission area TA is concave, the second inorganic encapsulation layer 133 over the organic encapsulation layer 132 may also be concave.

Figure 13:
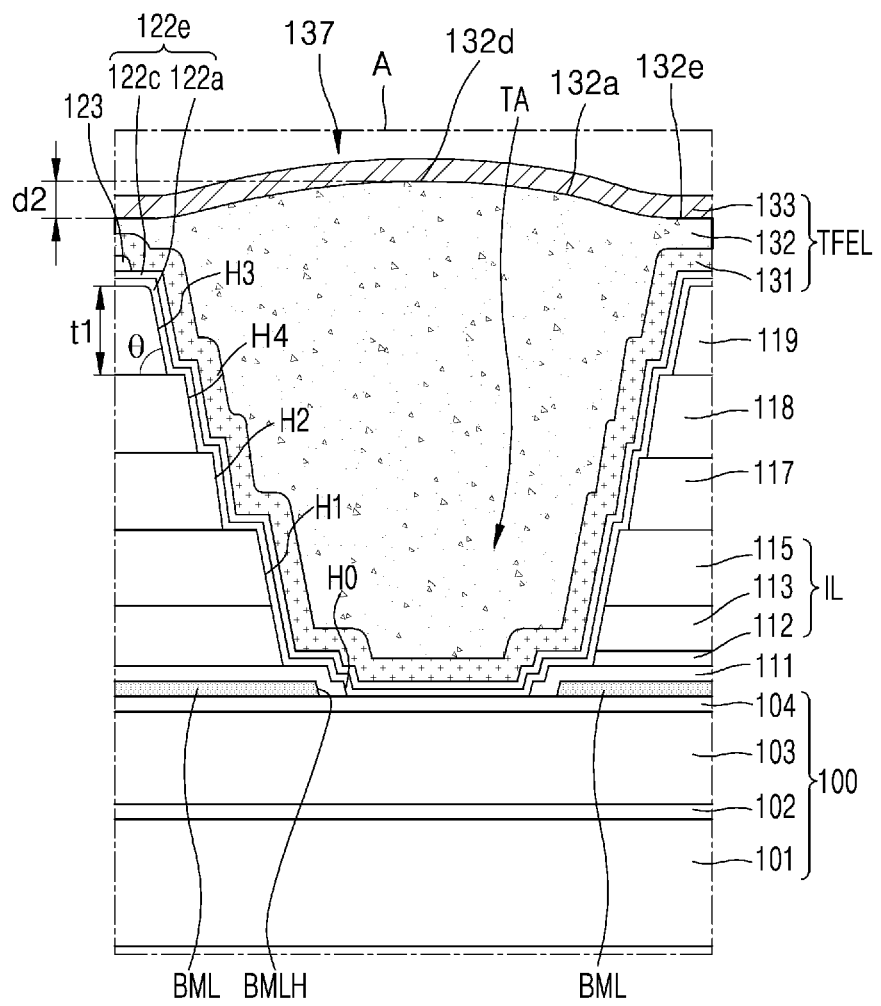
FIG. 13 is a cross-sectional view illustrating a portion of a display panel according to some example embodiments, which corresponds to an enlarged cross-sectional view of region A of FIG. 10.

FIG. 13 is a cross-sectional view illustrating a portion of a display panel according to some example embodiments, which corresponds to an enlarged cross-sectional view of region A of FIG. 10. The embodiments described with respect to FIG. 13 may be different from the embodiments described with respect to FIG. 11 in that an organic encapsulation layer 132 over the transmission area TA includes a convex portion 137. In FIG. 13, like reference numerals as those in FIG. 11 denote like members, and thus, some redundant descriptions thereof may be omitted for conciseness.

Referring to FIG. 13, an organic encapsulation layer 132 over the transmission area TA may include a convex portion 137. An upper surface 132a of the organic encapsulation layer 132 over the transmission area TA may be convex.

According to some example embodiments, a distance d2 from a bottom surface 132e of the upper surface 132a of the organic encapsulation layer 132 over the transmission area TA to a top surface 132d of the upper surface 132a of the organic encapsulation layer 132 may be more than about 0 μm and less than or equal to about 2 μm. When the distance d2 from the bottom surface 132e of the upper surface 132a of the organic encapsulation layer 132 over the transmission area TA to the top surface 132d of the upper surface 132a of the organic encapsulation layer 132 is more than about 2 μm, the component 40 arranged under the display panel 10 corresponding to the component area CA may be out of focus. Also, when the distance d2 from the bottom surface 132e of the upper surface 132a of the organic encapsulation layer 132 over the transmission area TA to the top surface 132d of the upper surface 132a of the organic encapsulation layer 132 is about 0 μm, the upper surface 132a of the organic encapsulation layer 132 may not be considered as being convex. Thus, because the distance d2 from the bottom surface 132e of the upper surface 132a of the organic encapsulation layer 132 over the transmission area TA to the top surface 132d of the upper surface 132a of the organic encapsulation layer 132 is more than about 0 μm and less than or equal to 2 μm, the component 40 arranged under the display panel 10 corresponding to the component area CA may be prevented from being out of focus.

Because the organic encapsulation layer 132 over the transmission area TA includes the convex portion 137 and thus the upper surface 132a of the organic encapsulation layer 132 over the transmission area TA is convex, the second inorganic encapsulation layer 133 over the organic encapsulation layer 132 may also be convex.

Figure 14:
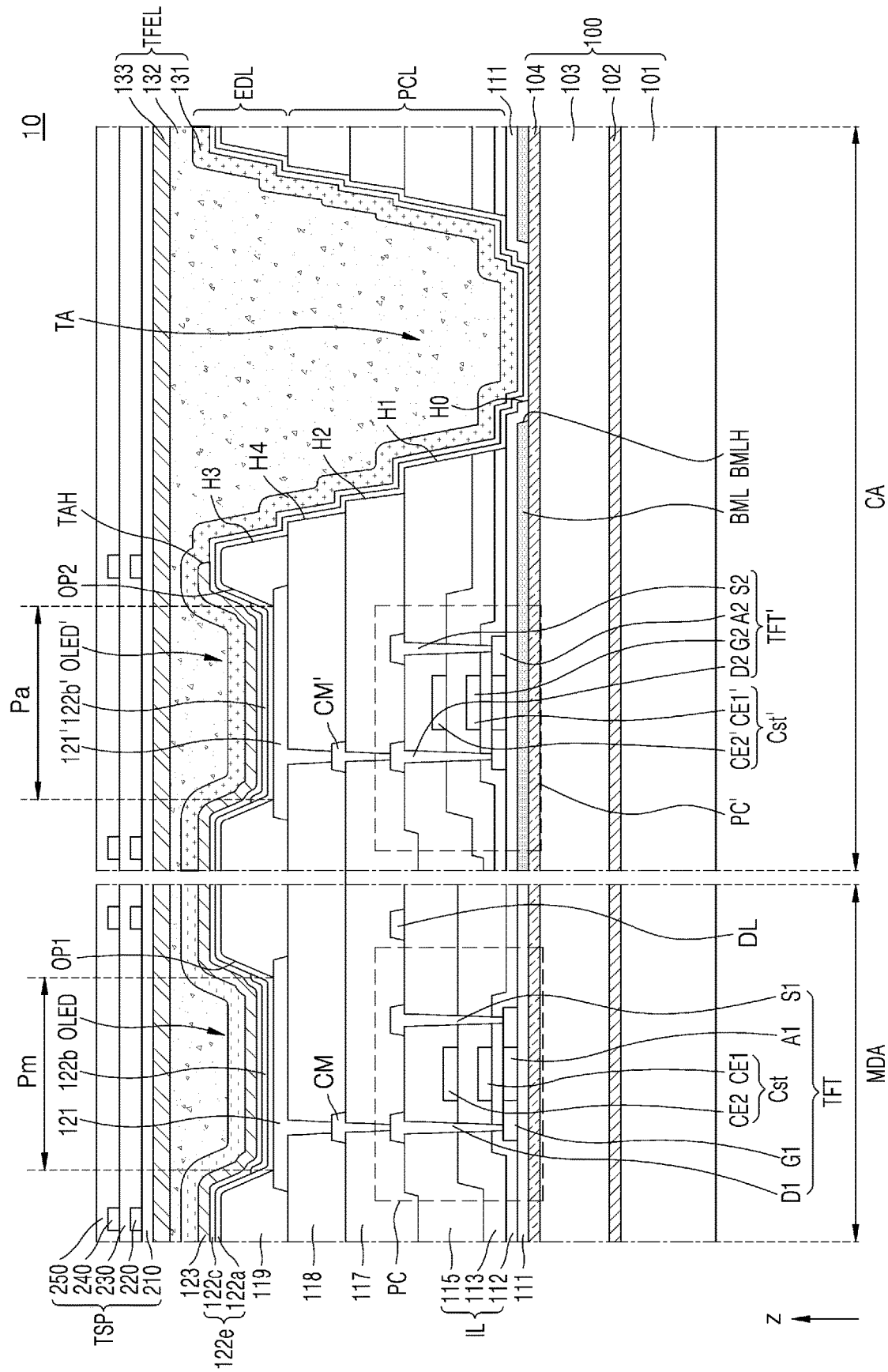
FIG. 14 is a cross-sectional view illustrating a portion of a display panel according to some example embodiments, which schematically illustrates a main display area and a component area.

FIG. 14 is a cross-sectional view illustrating a portion of a display panel according to some example embodiments, which schematically illustrates a main display area and a component area. The embodiments described with respect to FIG. 14 may be different from the embodiments described with respect to FIG. 9 in that a touch screen layer TSL may be further arranged on the thin film encapsulation layer TFEL. In FIG. 14, like reference numerals as those in FIG. 9 denote like members, and thus, some redundant descriptions thereof may be omitted for conciseness.

Referring to FIG. 14, a touch screen layer TSL may be arranged over the thin film encapsulation layer TFEL. The touch screen layer TSL may include a first touch insulating layer 210, a second touch insulating layer 230, and a third touch insulating layer 250. Also, the touch screen layer TSL may include a first touch electrode 220 arranged between the first touch insulating layer 210 and the second touch insulating layer 230 and a second touch electrode 240 arranged between the second touch insulating layer 230 and the third touch insulating layers 250. According to some example embodiments, the first touch electrode 220 and the second touch electrode 240 may be electrically connected through a contact hole defined in the second touch insulating layer 230. The first touch electrode 220 and the second touch electrode 240 may at least partially overlap the pixel definition layer 119 arranged thereunder.

The touch screen layer TSL may include driving electrodes and sensing electrodes. The touch screen layer TSL may be driven by a two-layer mutual capacitance method in which a driving signal is applied to the driving electrodes and then voltages charged in mutual capacitors are sensed through the sensing electrodes. The first touch electrode 220 and the second touch electrode 240 of the touch screen layer TSL may be the driving electrode or the sensing electrode.

According to some example embodiments, because the pixel definition layer 119 has a thickness of about 1.3 μm to about 2 μm, and the side surface of the pixel definition layer 119 is provided at an angle of about 30 degrees to about 40 degrees, the spreadability of the organic material constituting the organic encapsulation layer 132 of the thin film encapsulation layer TFEL may be improved to improve the flatness of the organic encapsulation layer 132 arranged over the transmission area TA.

Also, by improving the spreadability of the organic materials constituting the organic encapsulation layer 132 of the thin film encapsulation layers TFEL to improve the flatness of the organic encapsulation layer 132 arranged over the transmission area TA, the component 40 arranged under the display panel 10 corresponding to the component area CA may be prevented from being out of focus.

Also, the flatness and shape of the upper surface of the organic encapsulation layer 132 over the transmission area TA may be adjusted according to the characteristics of the component 40 arranged under the display panel 10 corresponding to the component area CA.

As described above, in the display panel and the display apparatus including the display panel according to some example embodiments, the flatness of the organic encapsulation layer corresponding to the transmission area may be secured by reducing the thickness of the pixel definition layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel including a main display area, a component area including a transmission area, and a peripheral area outside the main display area, the display panel comprising:
   a substrate;
   an inorganic insulating layer over the substrate and including a first hole corresponding to the transmission area;
   a planarization layer over the inorganic insulating layer;
   a pixel definition layer over the planarization layer and having a thickness of 1.3 μm to 2 μm; and
   a thin film encapsulation layer over the pixel definition layer,
   wherein an angle between a side surface of the pixel definition layer and an upper surface of the planarization layer is 30 degrees to 40 degrees.

2. The display panel of claim 1, wherein the pixel definition layer has a thickness of 1.3 μm to 2 μm from the upper surface of the planarization layer.

3. The display panel of claim 1, wherein a first inorganic encapsulation layer, an organic encapsulation layer, and a second inorganic encapsulation layer are sequentially stacked in the thin film encapsulation layer, and the organic encapsulation layer is in the first hole.

4. The display panel of claim 3, wherein the planarization layer includes a second hole corresponding to the transmission area, the pixel definition layer includes a third hole corresponding to the transmission area, and the organic encapsulation layer is in the second hole and the third hole.

5. The display panel of claim 4, wherein the organic encapsulation layer over the transmission area has a flat upper surface.

6. The display panel of claim 4, wherein the organic encapsulation layer over the transmission area includes a concave portion.

7. The display panel of claim 6, wherein a distance from a bottom surface of an upper surface of the organic encapsulation layer to a top surface of the upper surface of the organic encapsulation layer is more than 0 μm and less than or equal to 2 μm.

8. The display panel of claim 4, wherein the organic encapsulation layer over the transmission area includes a convex portion.

9. The display panel of claim 8, wherein a distance from a bottom surface of an upper surface of the organic encapsulation layer to a top surface of the upper surface of the organic encapsulation layer is more than 0 μm and less than or equal to 2 μm.

10. The display panel of claim 1, further comprising:
    a main display element over the planarization layer corresponding to the main display area; and
    an auxiliary display element over the planarization layer corresponding to the component area.

11. The display panel of claim 10, wherein the main display element includes a first pixel electrode, the auxiliary display element includes a second pixel electrode, and the pixel definition layer exposes at least a portion of the first pixel electrode and the second pixel electrode.

12. The display panel of claim 1, further comprising a touch screen layer over the thin film encapsulation layer,
    wherein a first touch insulating layer, a second touch insulating layer, and a third touch insulating layer are sequentially stacked in the touch screen layer, and
    the touch screen layer includes a first touch electrode between the first touch insulating layer and the second touch insulating layer and a second touch electrode between the second touch insulating layer and the third touch insulating layer.

13. The display panel of claim 12, wherein the first touch electrode and the second touch electrode at least partially overlap the pixel definition layer.

14. The display panel of claim 1, further comprising a bottom metal layer arranged between the substrate and the inorganic insulating layer in the component area and including a bottom hole corresponding to the transmission area.

15. A display panel including a main display area, a component area including a transmission area, and a peripheral area outside the main display area, the display panel comprising:
    a substrate;
    an inorganic insulating layer over the substrate and including a first hole corresponding to the transmission area;
    a pixel definition layer arranged over the inorganic insulating layer and having a thickness of 1.3 μm to 2 μm; and a thin film encapsulation layer over the pixel definition layer and including a first inorganic encapsulation layer, an organic encapsulation layer, and a second inorganic encapsulation layer, wherein the organic encapsulation layer includes a concave portion or a convex portion.

16. The display panel of claim 15, wherein a distance from a bottom surface of an upper surface of the organic encapsulation layer to a top surface of the upper surface of the organic encapsulation layer is more than 0 μm and less than or equal to 2 μm.

17. The display panel of claim 15, further comprising a planarization layer between the inorganic insulating layer and the pixel definition layer, wherein the pixel definition layer has a thickness of 1.3 μm to 2 μm from an upper surface of the planarization layer.

18. The display panel of claim 17, wherein an angle between a side surface of the pixel definition layer and the upper surface of the planarization layer is 30 degrees to 40 degrees.

19. The display panel of claim 15, wherein the organic encapsulation layer is in the first hole.

20. A display apparatus comprising:
a display panel including a main display area, a component area including a transmission area, and a peripheral area outside the main display area; and
a component under the display panel to correspond to the component area,
the display panel comprising:
a substrate;
an inorganic insulating layer over the substrate and including a first hole corresponding to the transmission area;
a planarization layer over the inorganic insulating layer;
a pixel definition layer over the planarization layer and having a thickness of 1.3 μm to 2 μm; and
a thin film encapsulation layer over the pixel definition layer,
wherein an angle between a side surface of the pixel definition layer and an upper surface of the planarization layer is 30 degrees to 40 degrees.

21. The display apparatus of claim 20, wherein the component includes an imaging device or a sensor.

22. The display apparatus of claim 20, wherein the pixel definition layer has a thickness of 1.3 μm to 2 μm from the upper surface of the planarization layer.

23. The display apparatus of claim 20, wherein a first inorganic encapsulation layer, an organic encapsulation layer, and a second inorganic encapsulation layer are sequentially stacked in the thin film encapsulation layer, and the organic encapsulation layer is in the first hole.

24. The display apparatus of claim 23, wherein the organic encapsulation layer over the transmission area has a flat upper surface.

25. The display apparatus of claim 23, wherein the organic encapsulation layer over the transmission area includes a concave portion or a convex portion.

26. The display apparatus of claim 25, wherein a distance from a bottom surface of an upper surface of the organic encapsulation layer to a top surface of the upper surface of the organic encapsulation layer is more than 0 μm and less than or equal to 2 μm.

* * * * *